United States Patent

Takeda et al.

Patent Number: 5,858,604
Date of Patent: Jan. 12, 1999

[54] PRESENSITIZED LITHOGRAPHIC PRINTING PLATE AND METHOD FOR PREPARING LITHOGRAPHIC PRINTING PLATE

[75] Inventors: Katsuyuki Takeda; Sota Kawakami; Katsumi Maejima; Koichi Nakatani; Shinji Matsumoto, all of Hino, Japan

[73] Assignee: Konica Corporation, Toyko, Japan

[21] Appl. No.: 592,325

[22] PCT Filed: Jul. 11, 1995

[86] PCT No.: PCT/JP95/01374

§ 371 Date: Jan. 16, 1996

§ 102(e) Date: Jan. 16, 1996

[87] PCT Pub. No.: WO96/02021

PCT Pub. Date: Jan. 25, 1996

[30] Foreign Application Priority Data

Jul. 11, 1994 [JP] Japan .................................. 6-158737
Aug. 18, 1994 [JP] Japan .................................. 6-194166
Jan. 6, 1995 [JP] Japan .................................. 7-000657

[51] Int. Cl.⁶ .......................... G03F 7/016; G03F 7/023
[52] U.S. Cl. .......................... 430/162; 430/156; 430/166; 430/200; 430/201; 430/273.1; 430/302; 430/328; 430/926; 430/944
[58] Field of Search ...................... 430/156, 162, 430/166, 273.1, 302, 328, 944, 945, 200, 201, 269, 926

[56] References Cited

U.S. PATENT DOCUMENTS

| | | |
|---|---|---|
| 3,606,922 | 9/1971 | Doggett .................................. 430/303 |
| 3,962,513 | 6/1976 | Eames .................................... 430/200 |
| 3,964,389 | 6/1976 | Peterson ................................ 101/467 |
| 4,020,762 | 5/1977 | Peterson ................................ 101/467 |
| 4,053,313 | 10/1977 | Fan ........................................ 430/166 |
| 4,132,168 | 1/1979 | Peterson ................................ 101/471 |
| 4,311,784 | 1/1982 | Fan ........................................ 430/166 |
| 4,347,305 | 8/1982 | Shiba et al. .............................. 430/166 |
| 4,515,877 | 5/1985 | Barzynski et al. ....................... 430/156 |
| 5,262,275 | 11/1993 | Fan ...................................... 430/273.1 |
| 5,506,086 | 4/1996 | Van Zoeren ............................ 430/201 |
| 5,605,780 | 2/1997 | Burberry et al. ....................... 430/944 |
| 5,607,814 | 3/1997 | Fan et al. .............................. 430/273.1 |

FOREIGN PATENT DOCUMENTS

| | | |
|---|---|---|
| 0 001 138 | 3/1979 | European Pat. Off. . |
| 53-23705 | 3/1978 | Japan . |
| 58-194595 | 11/1983 | Japan . |
| 3-197973 | 8/1991 | Japan . |
| 4-98260 | 3/1992 | Japan . |
| 5-11445 | 1/1993 | Japan . |
| WO 94/03839 | 2/1994 | WIPO . |

OTHER PUBLICATIONS

Patent Abstracts of Japan, vol. 007, No. 138 (P–204) (1983) of JP–A–58 052646.
Patent Abstracts of Japan, vol. 010, No. 190 (P–474) (1986) of JP–A–61 036750.
Patent Abstracts of Japan, vol. 010, No. 174 (M–490) (1986) of JP–A–61 024451.

*Primary Examiner*—John S. Chu
*Attorney, Agent, or Firm*—Frishauf, Holtz, Goodman, Langer & Chick, P.C.

[57] ABSTRACT

Object: A method for preparing a lithographic printing plate directly from digital image signals with the use of a presensitized lithographic printing plate comprising a support having thereon a photosensitive layer and a light-shielding layer which can be removed imagewise with laser light is provided, wherein the light-shielding layer, which can be industrially produced readily at a moderate price can be removed sufficiently during a process of development without the need of removing a masking layer at an unexposed portion and adverse effect on a photosensitive layer.

Constitution: A lithographic printing plate can be obtained by making use of a presensitized lithographic printing plate comprising a support having thereon a photosensitive layer containing o-quinonediazide compound, photo-degradable or photo-polymerizable resin and water-soluble resin and a light-shielding layer containing an infrared absorbing material and a material capable of absorbing the photosensitive wavelength of the photosensitive layer and by a process comprising ablating imagewise the light-shielding layer with laser light, overall-exposing with a ray active to the photosensitive layer to cause photochemical change of the photosensitive layer in which the light-shielding layer has been removed by ablation (e.g., making alkali-soluble) and dissolving out the photosensitive layer at a non-imaging area.

16 Claims, 3 Drawing Sheets

PRESENSITIZED LITHOGRAPHIC PRINTING PLATE AND METHOD FOR PREPARING LITHOGRAPHIC PRINTING PLATE

FIELD OF THE INVENTION

The present invention relates to a presensitized lithographic printing plate with high definition, a method for preparing a lithographic printing plate with the use thereof and an exposure apparatus for use in the preparing method.

BACKGROUND OF THE INVENTION

A lithographic printing plate has been prepared by a conventional method comprising a process of exposing a transparent original (e.g., a negative or positive film) in contact with a printing plate such as an aluminum plate or zinc plate each coated thereon with a photosensitive layer and developing the exposed plate. A positive-working photosensitive lithographic printing plate, for example, comprises a hydrophilic support having thereon a photosensitive ink-affinity layer capable of being solubilized upon imagewise-exposure to an actinic ray, such as ultraviolet radiation. When exposed and developed with an alkaline developer, an imaging area (nonexposed portion) remains and a non-imaging area (exposed portion) is removed to expose the hydrophilic surface of the support. As a result, the non-imaging area is capable of retaining water and thereby it repulses ink. On the other hand, the area (imaging area) which has not been removed through development, is hydrophobic so that it repulses water and becomes ink-receptible. The difference between the hydrophilic nonimaging area and the hydrophobic imaging area is employed in common lithographic printing. In a negative-working photosensitive lithographic printing plate, on the contrary, a photosensitive layer in an exposed portion (imaging area) is hardened and a photosensitive layer in an unexposed portion (non-imaging area) is removed by a developer so that it can be used as a lithographic printing plate.

With regard to editing the composition of a printing material which is a process prior to the preparing process of the printing plate, computer typesetting systems (CTS) made up of a combination of an automatic typesetting machine and computer, electronic composing and DTP (Desk Top Publishing) have become popular with the spread of word processors and personal computers. The computer generated data thus-edited is usually prepared as an original forme of a photographic film. If a printing plate material is available which enables making the printing plate directly from the output data of a CTS or aother electronic edting device, it is possible to shorten the printing process and also save intermediate materials. As a technique in response to the direct plate-making, it has been reported that there has been developed a plate-making material using an organic semi-conductor or silver salt photographic light sensitive material. However, as it still has defects such as needing a new processing step and the plate-life is insufficient, it has not yet become an acceptable substitute for pre-sensitized plates.

Thermal recording, in which an image canbe obtained directly through thermal energy of an input signal without developing and fixing, is a dry-processing system without intermediate chemical steps, therefore, it is broadly employed in facsimile and printers. Recently, there has been employed a thermal transfer recording system, in which thermal transfer recording can be accomplished by exposing a thermal transfer recording material to a laser beam which converts the laser beam to heat in the recording material. In this laser thermal-transfer recording system, the laser beam, used as energy supply can be condensed to such an extent that highly-resolution recording becomes feasible, leading to use in the printing of art works.

With respect to the image forming technique using lasers, there have been proposed applications for direct thermographic plate-making. In Japanese Patent examined No. 51-6568 is disclosed a technique, in which vapor-deposition coating of metal such as aluminum or copper, or a coating comprised of carbon black dispersed in an organic solvent-soluble binder is usable as an ablatable light-shielding layer.

However, in the case when a metal depositin coating is used as the ablatable light-shielding coating, it is problematic in that two wet-processing steps are required comprising removing a masking layer in an exposed portion and developing the photosensitive layer. Further, since a large apparatus for vapor-deposition is required for forming a vapor-deposited coating over a photosensitive layer on an industrial scale, it is difficult to provide it at a competitive low price. In cases when a coating of an organic solvent-soluble binder such as nitrocellulose is used as the ablatable light-shielding layer, on the other hand, the ablatable light-shielding layer can be coated using a technique similar to that of the photosensitive layer. However, while coating the shielding layer, the surface of the photosensitive layer is dissolved by an organic solvent contained in a coating solution and mixed with a part of the shielding layer, producing such problems that sensitivity of the photosensitive layer is likely to be decreased or printing stains are caused due to the incomplete removal of the shielding layer during development.

In view of the foregoing, the present invention was developed. Therefore, an object of the present invention is to provide a method of preparing a lithographic printing plate directly from a digital image signal without the use of any intermediate material in the plate-making process. Another object of the invention is to provide a technique for overcoming the above-described problems, so that, in a method for preparing a lithographic printing plate directly from a digital image signal, it is to provide a technique whereby an ablatable light-shielding layer can be readily formed at a low cost on an industrial scale, a process of removing only masking layer in an unexposed portion is not required, there is no adverse effect of the light-shielding layer on the photosensitive layer and any unablated portion of the light-shielding layer can be sufficiently removed during the developing process.

DISCLOSURE OF THE INVENTION

The above objects can be accomplished by the following constitution.

(1) A method for the preparation of a lithographic printing plate by a process comprising the steps of imagewise exposing a presensitized lithographic printing plate comprising a support having thereon a photosensitive layer and an ablatable light-shielding layer to a first light having a first wavelength to remove an imagewise exposed portion of the light-shielding layer by ablation, overall exposing the presensitized plate to a second light having a second wavelength to cause photochemical reaction in the photosensitive layer at portions in which the light-shielding layer has been removed and dipping the overall exposed plate into a developer to remove the unremoved light-shielding layer and a non-imaging portion of the photosensitive layer to obtain the lithographic printing plate.

Hereinafter, the second light having the second wavelength is referred to as an actinic ray. (An imaging portion, herein, refers to an area which is hydrophobic and ink-affinitive. In the case of a photosensitive layer being positive-working, the imaging portion refers to a portion unexposed to the actinic ray and in the case of a negative-working photosensitive layer, it refers to a portion exposed to the actinic ray. On the contrary, a nonimaging portion refers to an area which is hydrophilic and ink-repulsive, wherein, in the case of a positive-working photosensitive layer, the non-imaging portion refers to a portion exposed to the actinic ray and in the case of a negative-working photosensitive layer, it refers to a portion unexposed to the actinic ray.)

(2) The method for preparing a lithographic printing plate described in (1), characterized in that the first light has a power density of 100000 W/cm$^2$ or more and exposure thereof is made at an exposing speed of 0.4 m/sec. or more.

(3) The method for preparing a lithographic printing plate described in (1) or (2), characterized in that exposure is made by a high intensity from the side of the light-shielding layer.

(4) A presensitized lithographic printing plate comprising a support having thereon a photosensitive layer and an ablatable light-shielding layer, characterized in that said light-shielding layer contains a compound capable of absorbing a light having a first wavelength, a compound having an absorption in a photosensitive wavelength range of the photosensitive layer, thus, a compound capable of absorbing a light having a second wavelength and an alkaline water-soluble resin.

(5) A presensitized lithographic printing plate comprising a support having thereon a photosensitive layer and a light-shielding layer described in (4), characterized in that said light-shielding layer contains a near infrared-absorbing dye and a water-soluble resin.

(6) A presensitized lithographic printing plate comprising a support having thereon a photosensitive layer and a light-shielding layer described in (4) or (5), characterized in that said photosensitive layer contains a o-quinonediazide compound.

(7) A presensitized lithographic printing plate comprising a support having thereon a photosensitive layer and a light-shielding layer described in (4) or (5), characterized in that said photosensitive layer contains a diazo compound.

(8) A presensitized lithographic printing plate comprising a support having thereon a photosensitive layer and a light-shielding layer described in (4), (5), (6) or (7), characterized in that said near infrared absorbing dye contained in said light-shielding layer is water-soluble.

(9) A presensitized lithographic printing plate comprising a support having thereon a photosensitive layer and a light-shielding layer described in (4), (5), (6) or (7), characterized in that said near infrared absorbing dye contained in said light-shielding layer is oil-soluble, said dye being dispersed, with a oil-soluble low-molecular compound, in a water-soluble resin.

(10) An apparatus for exposing a presensitized lithographic printing plate comprising a means for feeding a presensitized lithographic printing plate, a means for holding the presensitized plate, a means for exposing selectively the presensitized plate to a high intensity light in response to an image information and a means for exposing overall to an actinic ray to cause photochemical reaction in the photosensitive layer.

In the above-described method for the preparation of a lithographic printing plate, an embodiment in whicht exposure is made by a light having a first wavelength having a power density of 100000 W/cm$^2$ or more at an exposing speed of 0.4 m/sec. or more, the high intensity light is laser light, exposure by the high intensity light is made from the side of the light-shielding layer and the light-shilding layer contains a water-soluble near infrared absorbing dye displays much more effects of the present invention so that it is a preferable embodiment of the invention.

Figure 1:
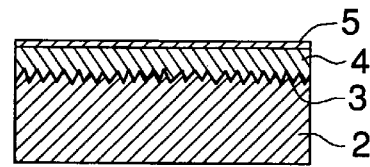
FIGS. 1(a) to 1(d) are schematic drawings for explaining the methof for preparing a lithographic printing plate of the present invention.
Figure 1:
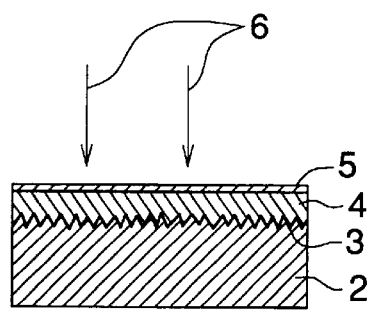
Figure 1:
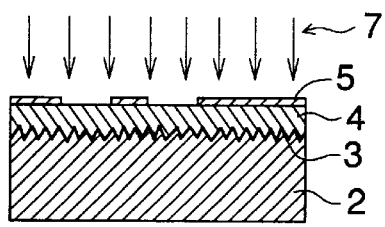
Figure 1:
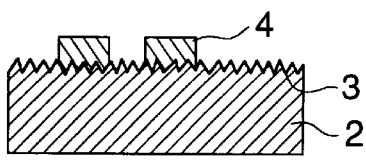

Explanation of the number:

13: Means for feeding a presensitized lithographic printing plate

15 and 31: Means for holding the presensitized plate

16 and 32: Holding member

17 and 34: means for mounting the presensitized plate

18 and 35: Pressure roll

22 and 33: Evacuation hole

23 and 37: Optical writing means

25 and 38: Overall exposing means

DETAILED DESCRIPTION OF THE INVENTION

The ablatable light-shielding layer of the present invention is functionally identical to a transparent original used in a preparation method of a lithographic printing plate known in the art. It can be therefore referred to as a masking layer.

Light having a first wavelength includes high intensity laser light, which is capable of removing the light-shielding layer of the invention by ablation. The first wavelength is preferably not less than 500 nm. It is preferable that a laser beam with a power density of 100000 W/cm$^2$ or more is exposed at an exposing speed 0.4 m/sec. or more.

The term, "ablation" means to make explosively a minute hole by heating locally and instantaneously with light such as laser to cause volume expansion including gasfying, in which a part is gasfied and scattering also occurs partly.

Light having a second wavelength is an actinic ray such as ultraviolet radiation, having a wavelength in which the photosensitive layer is allowed to be photochemically reacted. The second wavelength is preferably less tan 500 nm.

In a method for the preparation of a lithographic printing plate of the present invention, a light-shielding layer is abratively removed by a light having a first wavelength and a light having a second wavelength is exposed through removed portions (ablated holes) to cause photochemical reaction in a photosensitive layer. The term, "cause chemical reaction in a photosensitive layer" is meant to cause to change the solubility of the photosensitive layer in a developer. In the case of a negative-working photosensitive layer, an exposed portion is photo-polymerized or photochemically cross-linked to become insoluble in a developer and an unexposed portion remains unchanged to be soluble to a developer. An ablatively-unremoved portion in which a light-shielding layer is remained substantially cut off the second wavelength so as to prevent a photochemical reaction from occurring in the photosensitive layer. The term, "substantially cut off" is meant to cut off to such extent that, as a result of the chemical reaction, an imaging portion and nonimaging portion become differentiable with respect to the solubility in a developer. It is preferable to cut off 97% or more of the second wavelength. To remove ablatively the light-shielding layer by the light having the first wavelength, the light-shielding layer absorbs preferably 80% or more of the first wavelength.

With regard to a support used in the presensitized lithographic printing plate of the present invention, if it is superior in dimensional stability and proof against heat source such as laser used in image recording, it is not limitative. Examples thereof include a thin sheet paper such as condenser paper or glassine paper; heat-stable plastic resin films such as polyethylene terephthalate, polyamide, polycarbonate, polysulfone,polyvinyl alcohol, cellophan and polystylene; metal plates such as aluminum (including alloy thereof), zinc, iron and cupper. Among these, is preferable an aluminum plate. A preferable aluminum plate is a pure aluminum plate or alloy plate thereof which contains a small amount of foreign element(s). A plastic film laminated or vapor-deposited with aluminum may be usable. The content of a foreign element contained in aluminum alloy is preferably not more than 10% by weight. The thickness of the support is preferably 100 to 600 $\mu$m, more preferably 200 to 400 $\mu$m.

An aluminum plate is subjected to a degrease treatment with a solvent, acid or alkali for the purpose of removing oils sticked to the surface. Subsequently, it is preferably subjected to surface treatments such as graining and anodic oxidation, and hole-sealing, if necessary. These treatments can be conducted according to the methods known in the art.

A graining treatment method includes a mechanical method and electrolytic etching method. As the mechanical method, are cited ball polishing, brush polishing, liquid honing polishing and buff polishing. These methods are employed singly or in combination thereof in accordance with the composition of aluminum materials.

The electrolytic etching is carried out in a bath containing an inorganic acid such as hydrochloric acid or nitric acid. After the graining treatment, it is optionally subjected to death matting treatment with the use of an alkaline or acidic aqueous solution, and then neutralized and washed.

The anodic oxidation is conducted through electrolysis with the use of, as an electrolytic solution, sulfuric acid, chromic acid, oxalic acid, phosphoric acid, malonic acid or a mixture thereof; and an aluminum plate as an anode. The amount of anodic oxidation coating formed is 1 to 50 mg/dm$^2$, preferably 10 to 40 mg/dm$^2$, more prefrably 25 to 40 mg/dm$^2$. The amount of the anodic oxidation coating can be determined, for example, in such a manner that an aluminum plate is dipped into a phosphoric and chromic acid solution (35 ml of 85% phosphoric acid solution and 20 g of chromium oxide are dissolved in 1 liter of water) to dissolve out the oxidation coating, and difference of the plate weight between before and after being dipped is measured.

As examples of the hole-sealing treatment are cited treatment with the use of boiled water, water vapor, silic acid and aqueous dichromate solution. Furthermore, an aluminum support may be subjected to a subbing treatment with the use of a water-soluble polymeric compound or aqueous solution of a metal salt such as fluorozirconate.

On a support such as the thus-prepared aluminum plate which has hydrophilic surfaces is provided a photosensitive layer comprising known photosensitive composition. As the photosensitive composition, are used a positive working photosensitive composition containing a o-quinonediazide compound as a photosensitive component and a negative working photosensitive composition containing, as a photosensitive component, a photosensitive diazo compound, photo-polymerizable compound such as a monomer having an unsaturated double bond, or cinnamic acid or a photo-crosslinkable compound having a dimethylmaleimido group.

As o-quinonediazide compounds used as a positive working photosensitive composition, ester compounds of o-quinonediazidosulfonic acid with a polycondensate resin comprising a phenol and aldehyde (or ketone) are prefable. The phenols include phenols such as phenol, o-cresol, m-cresol, p-cresol, 3,5-xylenol, carvacrol and thymol; dihydroxybenzenes such as catecohol, resorcin and hydroquinone; and trihydroxybenzenes such as pyrogallol and phloroglucide. The aldehyde includes formaldehyde, benzaldehyde, acetoaldehyde, crotonaldehyde or furfural.

As examples of the polycondensate resin are cited phenol-formaldehyde resin, p-cresol-formaldehyde resin, m-cresol-formaldehyde resin, m- and p-mixed cresol resin, resorcin-benzaldehyde resin and pyrogallol-acetone resin. In afore-described o-quinonediazide compounds, a condensation ratio of o-quinonediazidosulfonic acid to the OH-group of phenols (reaction ratio per OH group) is preferably 15 to 80%, more preferably 20 o 60%.

As o-quinonediazide compounds used in the present invention, compounds described in JP-A 58-43451 may be usable. Examples thereof include a 1,2-naphthoquinonediazide compound such as 1,2-naphthoquinonediazidosulfonic acid ester or 1,2-naphthoquinonediazidosulfonic acid imide, more concretely are cited 1,2-naphthoquinonediazide compounds such as 1,2-naphthoquinonediazido-5-sulfonic acid cyclohexyl ester, 1-(1,2-naphthoquinonediazido-5-sulfonyl)-3,5-dimethylpyrazole, 1,2-naphthoquinonediazido-5-sulfonic acid-4"-hydroxydiphenyl-4'-azo-β-naphthol ester, N,N-di-(1,2-naphthoquinonediazido-5-sulfonyl)-aniline, 2'-(1,2-naphthoquinonediazido-5-sulfonyloxy)-1-hyroy-anthraquinone, 1,2-naphthoquinonediazido-5 -sulfonic-acid-2,3,4-trihydoxybenzophenone ester, condensate of 1,2-naphthoquinonediazido-5-sulfonic-acid-chloride (2 mol) and 4,4'-diaminobenzophenone (1 mol), condensate of 1,2-naphthoquinonediazido-5-sulfonic-acid-chloride (2 mol) and 4,4'-dihydroxy-1,1'-diphenylsulfon (1 mol), condensate of 1,2-naphthoquinonediazido-5-sulfonic-acid-chloride (1 mol) and purpurogallin (1 mol), and 1,2-naphthoquinonediazido-5-(N-dihydroxyabiethyl)-sulfonamide, as discribed in J. Kosar, "Light-Sensitive System" pages 339–352 (1965), John Wiley & Sons (New York) and W. S. De Frest, "Photoresist" Vol.50 (1975), McGraw-Hill (New York). Further, are cited 1,2-naphthoquinonediazide compounds described Japanese Patent examined 7-1953, 37-3627, 37-13109, 40-26126, 40-3801, 45-5604, 45-27345, 51-13013, JP-A 48-96575, 48-63802 and 48-63803.

As o-quinonediazide compound usable in the present invention, furthermore, are cited 1,2-naphthoquinonediazido-4-sulfonic-acid ester compounds such as 1,2-naphthoquinonediazido-4-sulfonic acid cyclohexylester, 1-(1,2-naphthoquinonediazido-4-sulfonyl)-3,5-dimethylpyrazole, 1,2-naphthoquinonediazido-4-sulfonic acid-4"-hydroxydiphenyl-4'-azo-β-naphthol ester, 2'-(1,2-naphthoquinonediazido-4sulfonyloxy)-1-hyroyanthraquinone, 1,2-naphthoquinonediazido-4-sulfonic-acid-2,3,4-trihydoxybenzophenone ester, 1,2-naphthoquinonediazido-4-sulfonic-acid-2,3,4,4'-tetrahydroxybenzophenone ester, condensate of 1,2-naphthoquinonediazido-4-sulfonic-acid-chloride (2 mol) and 4,4'-dihydroxy-1,1'-diphenylsulfon (1 mol), condensate of 1,2-naphthoquinonediazido-4-sulfonic-acid-chloride (1 mol) and purpurogallin (1 mol).

The o-naphthoquinonediazide compounds as above-described may be used singly or in combination thereof. The proportopn of the o-naphthoquinonediazido compound contained in the photosensitive composition is preferably 5 to 60% by weight, more preferably 10 to 50% by weight.

The o-naphthoquinonediazido compound may singly constitute the photosensitive layer. However, it is preferable to make use in combination with an alkali-soluble resin as a binder. As the alkali-soluble resin, there may be usable various kinds of resins known in the art. Particularly, novolak resin and vinyl polymer having a structure unit containing a phenolic OH group are preferable.

As a novolak resin used in the present invention are cited a resin obtained by the condensation of phenols with formaldehyde in the presence of acid catalyst. The phenols include phenol, o-cresol, m-cresol, p-cresol, 3,5-xylenol, 2,4-xylenol, 2,5xylenol, carvacrol, thymol, catechol, resorcin, hydroquinone, pyrogallol and phloroglucin. The above-described phenols are, singly or incombination, condensed with formaldehyde to obtain a resin. Particularly, preferable novolak resins are those obtained by the condensation polymerization of at least one of phenol, m-cresol (or o-cresol) and p-cresol, and formaldehye, for example, phenol-formaldehyde resin, m-cresol-formaldehyde resin, o-cresol-formaldehyde resin, phenol-p-cresol-formaldehyde copolymer resinm-cresol-p-cresol-formaldehyde copolymer resin, phenol-m-cresol-p-cresol-formaldehyde and phenol-o-cresol-p-cresol-formaldehyde. Among these novolak resin, phenol-o-cresol-p-cresol-formaldehyde copolymer resin is preferable.

In the present invention, the novolak resin may be used singly or in combination thereof.

The molecular weight of the novolak resin (polystyrene as standard) is $2.0\times10^3$ to $2.0\times10^4$ with respect to a weight-averaged molecular weight (Mw) and $7.0\times10^2$ to $5.0\times10^3$ with respect to number-averaged molecular weight (Mn), preferably $3.0\times10^3$ to $6.0\times10^3$ (Mw) and $7.7\times10^2$ to $1.2\times10^3$ (Mn).

The molecular weight of the novolak resin can be determined by GPC (Gel Permulation Chlomatography). The number-averaged molecular weight (Mn) and weight-averaged molecular weight (Mw) can be determined in a manner as described in M. Tsuge, T. Miyahashi & M. Tanaka, "Nihon Kagakukaishi" (Journal of the Chemical Society of Japan) page 800–805 (1972).

With regard to the vinyl type polymer having a structure containing a phenolic OH group, the polymer, which can be obtained through the polymerization involving carbon-carbon double bond cleavage has preferably a structure unit represented by the following formulas (1) to (6).

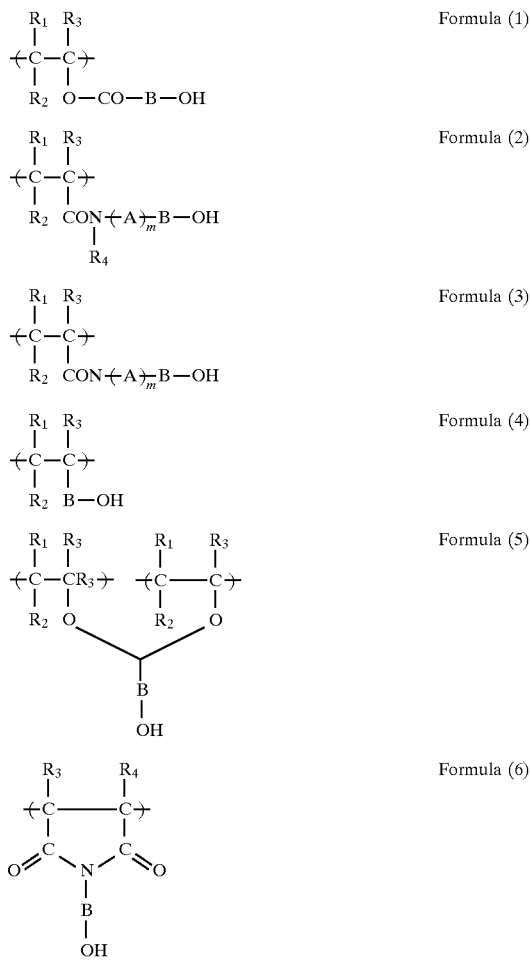

In the formulas, $R_1$ and $R_2$, each represent a hydrogen atom, alkyl group, carboxyl group and among these is preferable a hydrogen atom. $R_3$ represents a hydrogen atom, halogen atom, or alkyl group, and preferably a hydrogen atom or alkyl group such as methyl and ethyl. $R_4$ represents a hydrogen atom, alkyl group, aryl group, or aralkyl group, and preferably a hydrogen atom. A represents an alkylene group linking a nitrogen or oxygen atom with an aromatic carbon atom, which may be substituted; m is an integer of 0 to 10; and B represents a phenylene group or naphthylene group, each of which may be substituted. In the present invention, among these, is preferable a copolymer having a structure unit represented by formula (2).

The vinyl polymer above-described has preferably a copolymer type structure. In such a copolymer, a monomer unit which can be combined with at least one of the structure units represented by formulas (1) to (6) includes ethylenic unsaturated olefins such as ethylene, propylene, isobutylene, butadiene or isoprene; stylenes such as stylene, α-methystylene, p-methylstylene or p-chlorostylene; acrylic acid such as acrylic acid or methaacrylic acid; unsubstituted aliphatic carboxylic acid such as itaconic acid, maleic acid or maleic acid anhydride; ester of α-methylene aliphatic carboxylic acid such as methylacrylate, ethylacrylate, n-butylacrylate, isobutylacrylate, dodecylacrylate, 2-chloroethylacrylate, phenylacrylate, methyl-α-chloroacrylate, methylmethaacrylate, ethylmethaacrylate or ethylethaacrylate; nitrile such as acrylonitrile or methaacrylonitrile; amide such as acrylamide; anilide such as acrylanilide, p-chloroacrylanilide, m-nitroacrylanilide or m-methoxyacrylanilide; vinyl ester such as vinylacetate, vinylpropionate, vinylbenzoate or vinylbutylate; vinyl ether such as methylvinyl ether, ethylvinyl ether, isobutylvinyl ether or β-chloroethylvunyl ether; vinyl chloride; vinylidene chloride; vinylidene cyanate; ethylene derivative such as 1-methylene-1-methoxyethylene, 1,1-dimethoxyethylene, 1,2-dimethoxyethylne, 1,1-dimethoxycarbonylethylene or 1-methyl-1-nitroethylene; N-vinyl compound such as N-vinylpyrrole, N-vinylcarbazole, N-vinylindole, N-vinylpyrrolidene or N-vinylpyrrolidone.

Among the monomers above-described, (metha)acrylates, aliphatic monocarboxylic acid esters and nitrites are preferable; and methaacrylic acid, methyl methaacrylate, acrylonirile and ethyl acrylate are more preferable.

These monomers may be bonded in the form of block or at ramdom in the vinyl polymer afore-decribed.

The proportion of the struture unit represented by formulas (1) to (6) contained in the vinyl polymer is preferably 5 to 70 mol%, more prefrably 10 to 40 mol%.

The foregoing polymer may be incorporated in the photosensitive composition singly or in combination thereof.

Exemplary vinyl polymers are shown as below, in which Mw and Mn refer to a weight-averaged molecular weight and number-averaged molecular weight, respectively; s, k, l, o, m and n each represent mol % of the structure unit.

Exemplified compound

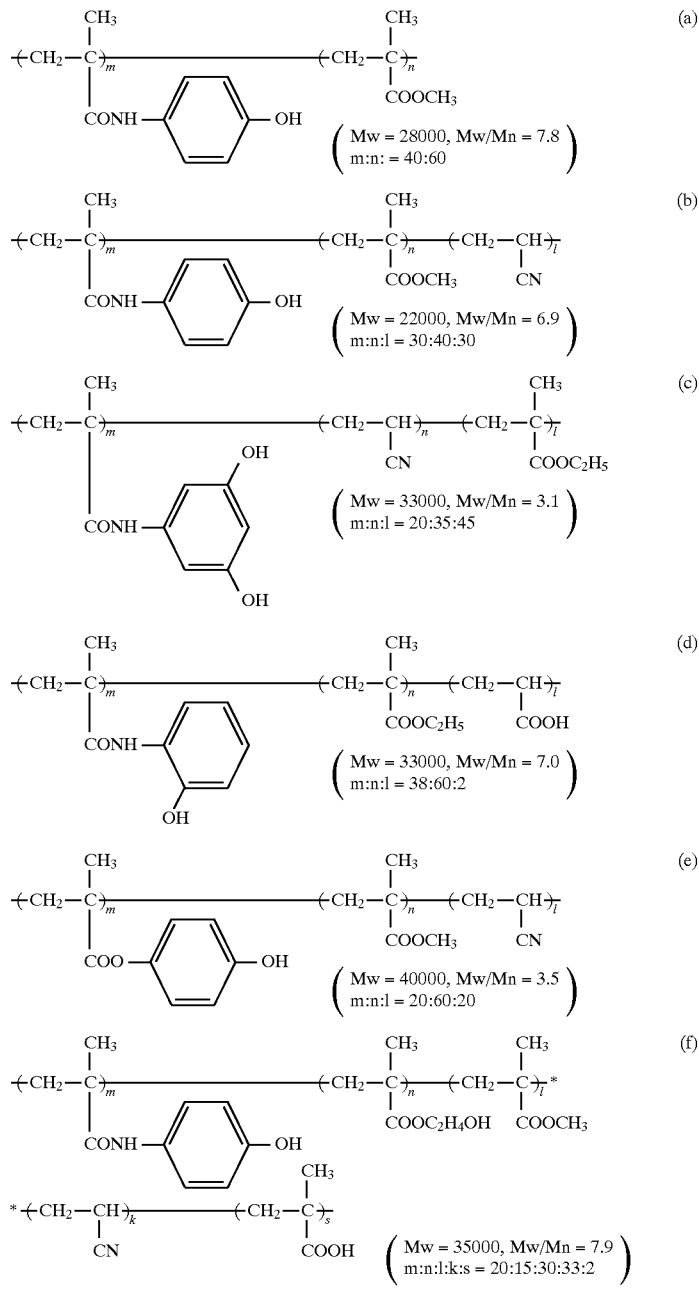

-continued
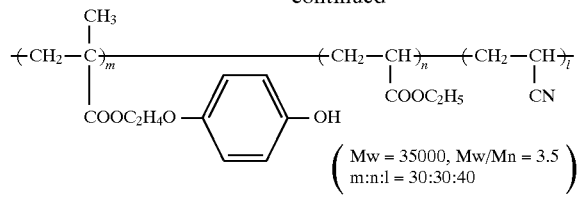
(g)
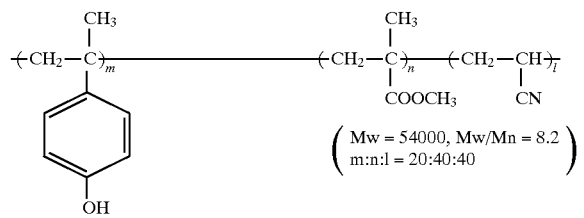
(h)
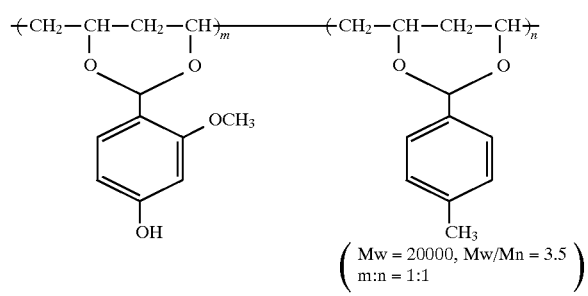
(i)
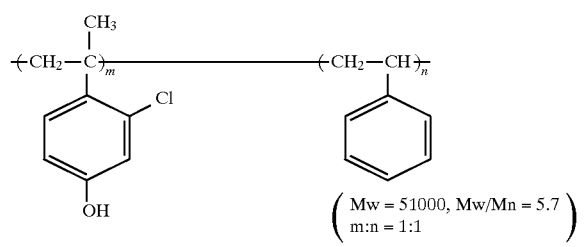
(j)
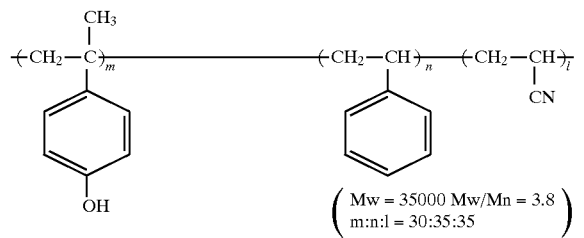
(k)
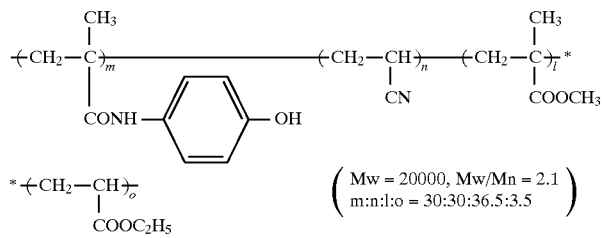
(l)
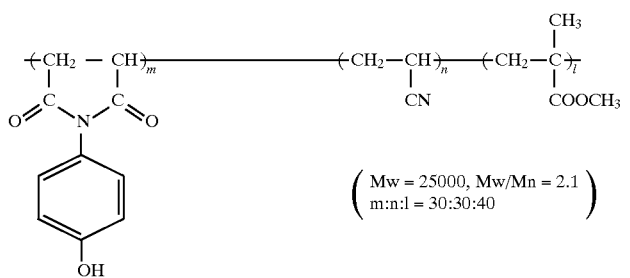
(m)

The proportion of the alkali-soluble resin afore-described contained in the photosensitive composition is preferably 50 to 95 mol %, more preferably 60 to 90 mol %.

The photosensitive composition may contain optionally an organic acid or acid anhydride. As the organic acid various kinds of organic acid known in the art may be usable. The acid has prefrably a pKa of 2 or more, more preferably 3.0 to 9.0, most preferably 3.5 to 8.0.

These organic acids are referred to organic acids described in "Kagaku Binran Kisohen", Maruzen (1966) pages 1054–1058. These compound include benzoic acid, adipinic acid, azelaic acid, isophthalic acid, p-toluic acid, β-ethylglutaric acid, m-oxybenzoic acid, p-oxybenzoic acid, 3,5-dimethylbenzoic acid, 3,4-dimethoxybenzoic acid, glyceric acid, glutaconic acid, glutaric acid, p-anisic acid, succinic acid, sebacic cid, β,β-diethylglutaric acid, 1,1-cyclobutanedicarboxylic acid, 1,3-cyclobutanedicarboxylic acid, 1,1-cyclopentane-dicarboxylic acid, 1,2-cyclopentanedicarboxylic acid, 1,3-cyclopentanedicarboxylic acid, β,β-dimethylglutaric acid, dimethylmalonic acid, α-tartaric acid, suberic acid, terephthalic acid, pimelic acid, phthalic acid, fumaric acid, β-propylglutaric acid, propylmalonic acid, mandelic acid, meso-tartaric acid, β-methyglutaric acid, β,β-methylpropyl-glutaric acid, methylmalonic acid, malic acid, 1,1-cyclohexanedicarboxylic acid, 1,2-cyclohexanedicarboxylic acid, 1,3-cyclohexanedicarboxylic acid, 1,4-cyclohexanedicarboxylic acid, cis-4-cyclohexene-1,2-dicarboxylic acid, erucic acid, undecenic acid, lauric acid, n-capric acid, pelargonic acid and n-undecanic acid. Further, an organic acid having an enol structure including meludrumic acid and ascorbic acid is preferably used. The proportion of the organic acid contained in the photosensitive is 0.05 to 10% by weight, preferably 0.1 to 5% by weight.

With regard to the acid anhydride contained in the photosensitive composition, various kinds of acid anhydrides known in the art may be usable. The acid anhydride is preferably a cyclic acid anhydride, including phthalic anhydride, tetrahydrophthalic anhydride, hexahydrophthalic anhydride, 3,6-endooxy-Δ⁴-tetrahydrophthalic anhydride, tetrachlorophthalic anhydride, glutaric anhydride, maleic anhydride, chloromaleic anhydride, α-phenylmaleic anhydride, succinic anhydride and pyromellitic anhydride. The acid anhydride is contained in the photosensitive layer in an amount of 0.05 to 10% by weight, preferably 0.1 to 5% by weight.

The photosensitive composition contains preferably a compound capable of forming an acid or radical upon exposure to light. The compound is a trihaloalkyl compound or diazonium salt compound represented by the following formula (7) or (8).

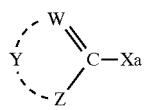

Formula (7)

In formula (7), Xa represents a trihaloalkyl group having 1 to 3 carbon atoms; W represents an atom of N, S, Se, P or C; Z represents an atom selected from O, N, S, Se and P; Y represents a nonmetal atomic group necessary for forming a ring containing a chromophore, provided that the ring formed may contain Xa.

Formula (8)

In formula (8), Ar represents an aryl group, and X⁻ represents a counter ion.

Concretely, the trihaloalkyl compound represented bu formula (7) includes a compound represented by formula (9), (10) or (11).

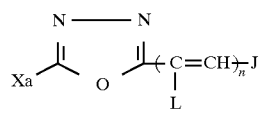

Formula (9)

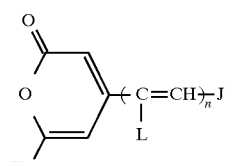

Formula (10)

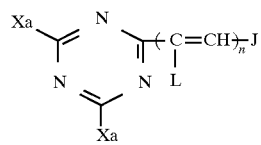

Formula (11)

In formulas (9) to (11), Xa represents a trihaloalkyl group having 1 to 3 carbon atoms, L represents a hydrogen atom or a methyl group, J an aryl group or heterocyclic group, each of which may be substituted, and n is an integer of 0, 1 or 2.

As examples of the compound represented bu formula (11), are cited bezofuran ring-containing oxadiazole compounds such as the following compounds as shown below;

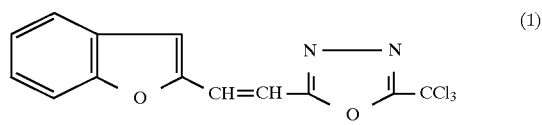

(1)

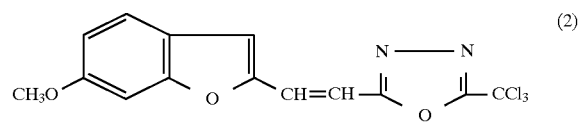

(2)

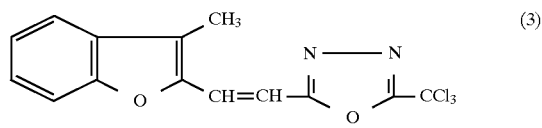

(3)

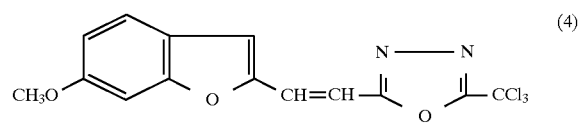

(4)

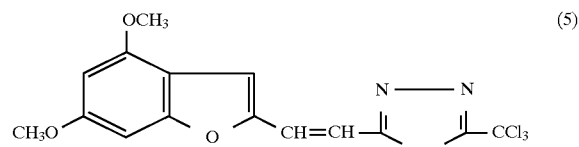

(5)

2-trichloromethyl-5-(p-methoxystylyl)-1,3,4-oxadiazole compounds described in JP-A 54-74728;

compounds described in JP-A 60-241049 as shown below;

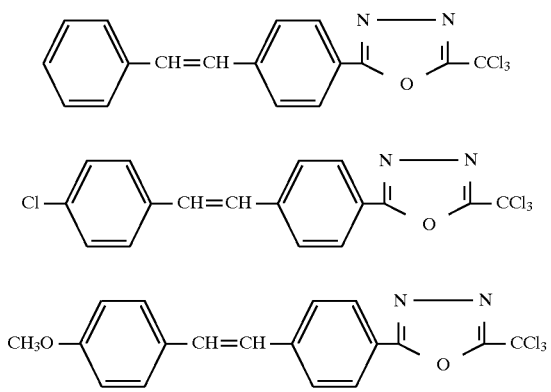

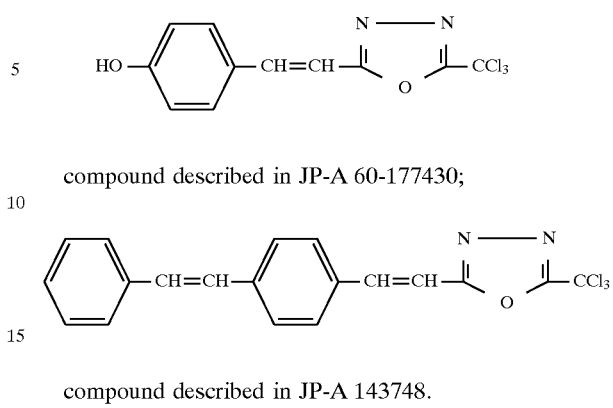

compound described in JP-A 60-3626;

compound described in JP-A 60-177430;

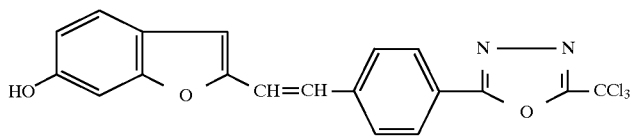

compound described in JP-A 143748.

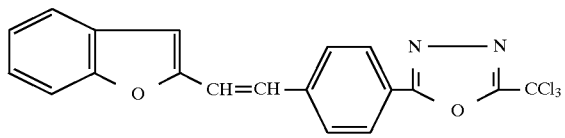

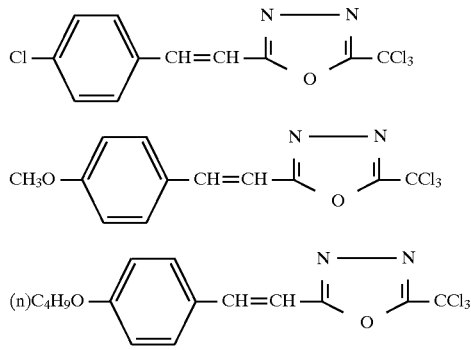

-continued compound described in JP-A 54-74728 as shown below;

compounds described in JP-A 55-77742;

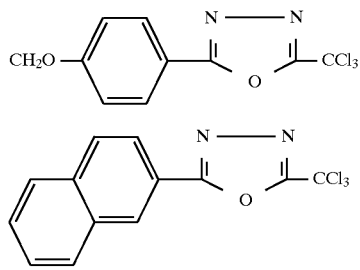

As examples of the compounds represented by formulas (10) and (11) are cited a 4-(2,4-dimethoy-4-stylyl)-6-trichloromethyl-2-pyrrone compound described in JP-A 53-36223, and a 2,4-bis-(trichloromethyl)-6-p-methoxystylyl-s-triazine compound and 2,4-bis-(trichloromethyl)-6-p-dimethylaminostylyl-s-triazine compound described in JP-A 48-36281.

With regard to the diazonium compond, is preferble a diazonium compound capable of producing a strong Lewis base upon exposure to light. A counter ion thereof is preferably an inorganic compound ion. As an example of the compound is cited an aromatic diazonium salt, an anion portion of which is a phosphorus fluoride ion, arsenic fluoride ion, antimony fluoride ion, antimony chloride, tin chloride, bismuth chloride or zinc chloride ion. A p-diazophenylamine salt is preferable.

The compound capable of forming an acid or radical upon exposure to light is contained in an amount of 0.01 to 20% by weight, preferably 0.1 to 20% by weight and more preferably 0.2 to 10% by weight based on the total photosensitive composition.

In combination with the compound capable of forming an acid or radical upon exposure to light, the photosensitive composition may contain a color changing agent, which changes color upon reaction with a photolytic product of the compound. The color changing agent is classified into two types of color-forming and discoloring or color-changing. The discoloring or color-changing type color changing agent includes various dyes such as diphenylmethane dyes, triphenylmethane type thiazine dyes, oxazine dyes, xanthene dyes, anthraquinone dyes, iminonaphthoquinone dyes and azomethine dyes.

As examples thereof are cited Briliant green, Eosin, Ethyl violet, Erythrosin B, Methyl green, Crystal violet, Basic fuchsine, Phenolphthalein, 1,3-diphenyltriazine, Alizarine red S, Thymolphthalein, Methyl violet 2B, Quinadine red, Rose bengale, Metanil yellow, Thymolsulfophthalein, Xylenol blue, Methyl orange, Orange IV, Diphenylthiocarbazone, 2,7-dichloro-fluoresein, Paramethyl red, Congo red, Benzopurpurin 4B, α-Naphthyl red, Nile blue 2B, Nile blue A, Phenaphthalene, Methyl violet, Para-fuchsine, Victoria pure blue BOH (product of Hodogaya Kagaku), Oil blue #603 (product of Orient Kagakukogyo), Oil pink #312 ( product of Orient Kagakukogyo), Oil red 5B ( product of Orient Kagakukogyo), Oil scarlet #308 (product of Orient Kagakukogyo), Oil red OG (product of Orient kagakukogyo), Oil red RR (product of Orient kagakukogyo), Oil green #502 (product of Orient kagakukogyo), Spiron red BEH special (product of Hodogaya Kagaku), m-Cresol purple, Cresol red, Rhodamine B, Rhodamine 6G, First acid violet R, Sulforhodamine, Auramine, 4-p-diethylaminophenylimino-naphthoquinone, 2-carbostearylamino-4-p-dihydroxyethylamino-phenyliminonaphthoquinone, p-methoxybenzoyl-p'-diethylamino-o'-methylphenyliminoacetoanilide, cyano-p-diethylaminophenyliminoacetoanilide, 1-phenyl-3-methyl-4-p-diethylaminophenylimino-5-pyrazolone and 1-β-naphthyl-4-p-diethylaminophenylimino-5-pyrazolone.

As color forming type color changing agents are cited aryl amines. The aryl amines include leuco dyes as well as amines such as a primary amine and secondary amine. Examples thereof include diphenylamine, dibenzylaniline, triphenylamine, diethylaniline, diphenyl-p-phenylenediamine, p-toluidine, 4,4'-biphenyldiamine, o-chloroaniline, o-bromoaniline, 4-chloro-0-phenylenediamine, o-brom-N,N-dimethylaniline, 1,2,3-triphenylguanidine, naphthylamine, diaminodiphenylmethane, aniline, 2,5-dichloroaniline, N-methyldiphenylamine, o-toluidine, p,p'-tetramethyldiaminodiphenylmethane, N,N-dimethyl-p-phenylenediamine, 1,2-dianilinoethylene, p,p',p"-hexamethyltriaminotriphenylmethane, p,p'-tetramethyldiaminotriphenylmethane, p,p'-tetramethyldiaminodiphenylmethylimine, p,p',p"-triamino-o-methyltriphenylmethane, p,p',p"-triaminotriphenylcarbinol, p,p'-tetramethylaminodiphenyl-4-anilinonaphthylmethane, p,p'p"-triaminotriphenylmethane and p,p'p"-hexapropyltriaminotriphenylmethane.

Among these color changing agents, in the invention, is preferable a dye capable of being color-changed within a pH range of 1 to 5. The proportion of the color changing agent contained in the photosensitive composition is 0.01 to 10% by weight, preferably 0.02 to 5% by weight.

The photosensitive composition contains preferably a condensation resin of a substituted phenol represented by the following formula (12) and an aldehyde, and/or an ester compound of the resin with o-naphthoquinonediazidosulfonic acid.

Foemula (12)

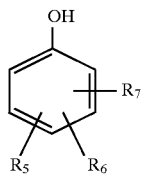

In the formula, $R_5$ and $R_6$ each represent a hydrogen atom, alkyl group (including analkyl group having 1 to 3 carbon atom, preferably 1 or 2 carbon atoms) or a halogen atom (including fluorine, chlorine, bromine and iodide, preferably chlorine and bromine); $R_7$ representsan alkyl group having 2 or more carbon atoms (preferably 15 or less carbon atoms and more preferably 3 to 8 carbon atoms) or a cycloalkyl group (including one having 3 to 8 carbon atoms, more preferably 3 to 8 carbon atoms).

Examples of the substituted phenols include isopropylphenol, tert-butylphenol, tert-amylphenol, hexylphenol, tert-octylphenol, cyclohexylphenol, 3-methyl-4-chloro-5-tert-butylphenol, isopropylcresol, tert-butylcresol, tert-amylcresol, hexylcresol, tert-octylcresol and tert-butylcresol. Among these are preferable tert-octylphenol and tert-butylphenol.

Examples of the aldehyde include aliphatic and aromatic aldehydes such as formaldehyde, benzaldehyde, acetoaldehyde, acrolein, crotonaldehyde and furfural, including 1 to 6 carbon atoms. Among these are preferable formaldehyde and benzaldehyde.

The condensation resin of the substituted phenol with the aldehyde can be synthesized by the condensation polymerization of the substituted phenol represented by formula (12) and the aldehyde in the presence of an acid catalyst. As the acid catalyst, an inorganic or organic acid such as hydrochloric acid, oxalic acid, sulfuric acid or phosphoric acid is usable. The ratio of the substituted phenol to the aldehyde is 0.7 to 1.0 mol of the aldehyde per 1 mol of the phenol. As a reaction solvent, for example, an alcohol, aceton, water or tetrahydrofiran is usable. The reaction is carried out at a given temperature (−5° to 120° C.) and over a period of time (3 to 48 hrs.), subsequently heated under reduced pressure and subjected to water-washing. Thereafter, the product can be obtained by dehydration or precipitation.

The ester compound of the condensation resin of the phenol and aldehyde with an o-naphthoquinonediazidosulfonic acid can be prepared by a process comprising dissolving the resin in an appropriate solvent such as dioxane; adding thereto o-naphthoquinonediazidosufonic acid chloride; and drop-wise adding an alkali such as sodium carbonate until reaching the equivalent point to make esterfication.

In the ester compound, the condensation ratio of the o-naphthoquinonediazidosulfonic acid chloride to a hydroxy group of the phenol (reaction ratio per hydroxy group) is preferably 5 to 80%, more preferably 20 to 70% and further more preferably 30 to 60%. The condensation ratio can be calculated by determining a sulfur atom content of sulfonyl groups through elemental analysis.

The condensation resin of the substituted phenol represented by formula (12) and the aldehyde, and the o-naphthoquinonediazidosulfonic acid ester of the resin each are contained in amount of 0.05 to 15% by weight, preferably 1 to 10% by weight. The weight-averaged molecular weight (Mw) thereof each are in a range of $5.0 \times 10^2$ to $5.0 \times 10^3$, preferably $7.0 \times 10^2$ to $3.0 \times 10^3$. The number-averaged molecular weight (Mn) thereof each are $3.0 \times 10^2$ to $2.5 \times 10^3$, preferably $4.0 \times 10^2$ to $2.0 \times 10^3$.

The molecular weights above-described can be measured by a GPC method. The number-averaged molecular weight and weight-averaged molecular weight can be calculated in accordance with the method described in M. Tsuge, T. Miyahashi & S. Tanaka, "Nihon Kagakukaishi" page 800–805, (1972).

The photosensitive composition may further contain a compound having at least one of the following structure units (D) and (E), Structure unit [D]: —(CH$_2$CH$_2$O)$_n$—

Structure unit [E]: —[CH$_2$CH(CH$_3$)—O]$_n$—

(In the formulas, n is an integer of 2 to 5000.)

The compound having at least one of the structure units (D) and (E) includes any one having either or both of the structure units (D) and (E), which have preferably n of 2 to 5000 and a boiling point of 240° C. or higher, more preferably 2 to 500 and 280° C. or higher, and furthermore preferably n of 3 to 100.

Examples of these compound are cited as follows:

Polyethyleneglycol

Polyoxyethylene alkyl ether

Polyoxyethylen alkylphenyl ether

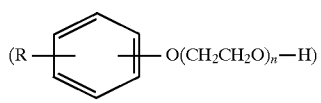

Polyoxyethylene polystylene phenyl ether

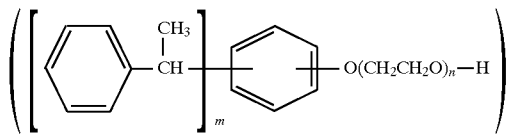

Polyoxyethylen-Polyoxypropylene glycol e.g.,

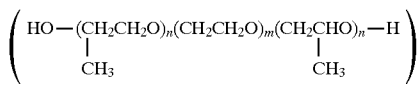

(including block polymer and random polymer)

Polyoxyethylen-Polyoxypropylene alkyl ether (alkylether is formed at the terminal, including a random polymer)

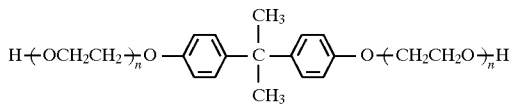

Ethylene oxide derivative of alkylphenol-formalin condensation product

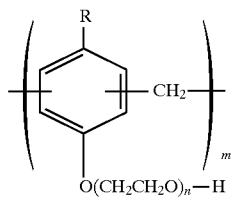

Polyoxyethylene-polyhydric alcohol partial ester e.g.,

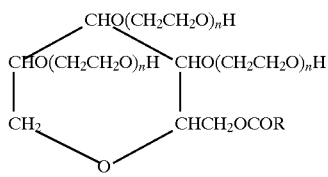

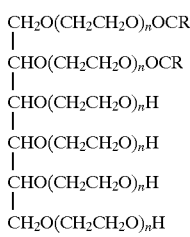

Polyoxyethylen-aliphatic acid ester (e.g., RCOO (CH$_2$CH$_2$O) nH

Polyoxyethylenealkylamine

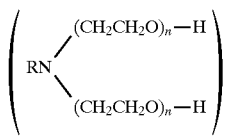

Preferable examples thereof are cited as follows: polyoxyethylene lauryl ether, polyoxyethylene cetyl ether, polyoxyethylene stearyl ether, polyoxyethylene oleyl ether, polyoxyethylene polyhydric alcohol ether, polyoxyethylene octylphenyl ether, polyoxyethylene nonylphenyl ether, polyoxyethylene sorbitan monolauryl ether, polyoxyethylene sorbitan monopalmitate ether, polyoxyethylene sorbitan monostearate, polyoxyethylene sorbitan tristearate, polyoxyethylenesorbitan monooleate, tetraoleic acid polyoxyethylene sorbite, polyethylene glycol monostearate, polyethylene glycol monooleate, polyethylene glycol distearate, polyoxyethylene nonylphenyl ether-formaldehyde condensation product, block polymer of oxyethylene and oxypropylene, polyethylene glycol and tetraethylene glycol.

The proportion of the compound having the structure unit (D) or (E) contained in the photosensitive composition is preferably 0.1 to 20% by weight, more preferably 0.2 to 10% by weight based on the total composition. The compound may be used singly or in combination thereof.

Further, a colorant such as a dye or pigment, sensitizer, plasicizer or surfactant may optionally incorporated into the photosensitive composition.

These components are dissolved in a solvent as described below and coated on an appropriate support to provide a photosensitive layer, and a presensitized lithographic printing plate can be obtained.

As solvents used for dissolving components of the photosensitive composition afore-described, are cited cellosolves such as methyl cellosolve, methyl cellosolve acetate, ethyl cellosolve and ethyl cellosolve acetate; dimethylformamide; dimethylsulfoxide; dioxane; acetone; cyclohexane; trichloroethylene and methylethylketone. These solvents may be used singly or in combimation thereof.

The negative-working photosensitive composition includes a photosensitive composition containing a photosensitive diazo compound, a photopolymerizing compound or a photocross-linking compound. The photo-hardenable, photosensitive composition containing photosensitive diazo compound will be described as follows.

As the photosensitive diazo compound used in the present invention, are preferably used a diazonium resin which is prepared by condensing an aromatic diazonium salt, in an acidic medium, with an organic condensing agent including aldehydes such as formaldehyde and acetoaldehyde, and acetals. Further, there may be used a condensation copolymer resin of an aromatic diazonium salt and aromatic sulfonic acid (salt) compound with formaldehyde.

The diazonium resin includes, for example, a condensation product of p-diazodiphenylamine with formaldehyde or acetoaldehyde; a diazonium resin inorganic salt of an organic solvent-soluble product from a co-condensation product of p-diazodiphenylamine and benzenesulfonic acid (salt) with formaldehyde or acetoaldehyde, and a hexafluorophosphate or tetrafluoroborate; and an organic solvent-soluble diazonium resin organic acid salt of the above described condensation product, and a sulfonic acid such as p-toluenesulfonic acid (or salt), phosphinic acid such as benzenephosphinic acid (or salt) or hydroxyl group containing compound such as 2,4-dihydroxybenzophenone or 2-hydroxy-4-methoxybenzophenone-5-sulfonic acid (or salt).

Examples of the diazonium resin include 4-diazodiphenylamine hexafluorophosphate-formaldehyde resin, 4-diazophenylamine hexafluoriphosphate-acetoaldehyde resin, 4-diazo-4'-methoxydiphenylamine tetrafluoroborate-formaldehyde resin, 4-diazo-4'-methoxydiphenylamine tetrafluoroborate-acetoaldehyde resin, benzenesulfonic acid-4-diazodiphenylamine tetrafluoroborate-formaldehyde resin, benzenesulfonic acid-4-diazodiphenylamine tetrafluoroborate-acetoaldehyde resin and 4-diazodiphenylamine 2-hydroxy-4-methoxybenzophenone-5-sulfonate-formaldehyde resin.

With respect to the molecular weight of the diazonium resin, it is optionally variable, depending on a molar ratio of each monomer and condensation conditions. The molecular weight is feasible in a range of 400 to 10000, preferably 800 to 5000. The photosensitive diazonium resin may be contained, in the photosensitive layer, in an amount of 1 to 60% by weight, preferably 3 to 30% by weight.

The photosensitive diazonium resin used in the present invention is used preferably in combination with an alkali-soluble or swellable hydrophobic polymer compound. As the hydrophobic polymer compound, is cited a copolymer comprised of monomers (as a component unit) similar to those used in the afore-described photosensitive diazonium resin.

The monomers are selected from a compound having an addition-polymerizable, unsaturated bond including acrylamides, methacrylamides, α,β-unsaturated carboxylic acids, alkyl acrylates, alkyl methacrylates, vinyl ethers, vinyl esters, vinyl ketones, stylenes and olefins.

As examples thereof are cited those as shown in the following (1) through (10);

(1) α,β-unsaturated carboxylic acids such as acrylic acid, methacrylic acid and anhydrous maleic acid;

(2) alkyl acrylates such as methyl acrylate, ethyl acrylate, propyl acrylate, butyl acrylate, amyl acrylate, hexyl acrylate, octyly acrylate, chloroethyl acrylate, 2-hydroxyethyl acrylate, glycidyl acrylate and N-dimethylaminoethyl acrylate;

(3) alkyl methacrylates such as methyl methacrylate, ethyl methacrylate, propyl methacrylate, butyl methacrylate, amyl methacrylate, cyclohaxyl methacrylate, 2-hyroxyethyl methacrylate, 4-hydroxbutyl methacrylate, glycidyl methacrylate and N-dimethylaminoethyl acrylate;

(4) acrylamides or methacrylamides such as acrylamide, methacrylamide, N-methylolacrylamide, N-methylolmethacrylamide, N-ethylacrylamide, N-hexylmethacrylamide, N-cyclohexylacrylamide, N-hydroxyethylacrylamide, N-phenylacrylamide, N-hydoxyphenylmethacrylamide and N-ethyl-N-phenylacrylamie;

(5) vinyl ethers such as ethylvinyl ether, 2-chloroethylvinyl ether, hydroxyvinylethyl ether, propylvinyl ether, butylvinyl ether, octyvinyl ether and phenylvinyl ether;

(6) vinyl esters such as vinyl actate, vinyl chloroacetate, vinyl butylate and vinyl benzoate;

(7) stylenes such as α-methylstylene, methylstylene such as chloromethylstylene;

(8) vinyl ketones such as methyvinyl ketone, ethylvinyl ketone, propylvinyl ketone and phenylvinyl ketone;

(9) olefins such as ethylene, propylene, isobutylene, butadiene and isoprene; and

(10) N-vinylpyrrolidone, N-vinylcarbazole, 4-vinylpyridine, acrylonitrile and methacrylonitrile. Furthermore, there is included a monomer capable of polymerizing with a monomer represented by the following formula,

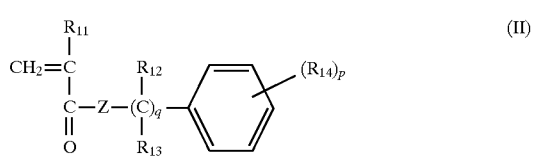

(II)

(In the formula, $R_{11}$ represents a hydrogen atom, halogen atom or alkyl group; $R_{12}$ and $R_{13}$ each represent a hydrogen atom or alkyl group; $R_{14}$ represents a carboxyl group, carboxylate group, sulfo group or sulfonate group; p is an integer of 1 to 3; q is an integer of 0 to 4; and Z represents —O— or —NH—.) Besides the above-described resins, a polyvinyl butyral resin, polyurethane resin, polyamide resin. epoxy resin, novorak resin, polyvinyl formal resin, polyester resin polycarbonate resin and natural resins are cited.

As preferable addition-polymerizing, unsaturated compounds, are cited α,β-unsaturated carboxylic acids such as acrylic acid and methacrylic acid; alkyl acrylates and alkyl methacrylate such as methyl acrylate, ethyl acrylate, methyl methacrylate and ethyl methacrylate; acrylonirile and methacryloniriole.

The above copolymer can be obtained by a conventional method, and molecular weight thereof (measured by GPC) is preferably 10,000 to 300,000, more preferably 20,000 to 250,000.

The amount of the hydrophobic polymer compound contained in the photosensitive composition is preferably 1 to 99% by weight, more preferably 5 to 95% by weight.

The photosensitive composition may further contain optionally a dye, pigment, coating aid or plasticizer.

Examples of the dye include triphenylmethane dyes, such as Victoria pure blue BOH (product by Hodogaya Kagaku), Oil blue #603 (product by Orient kagaku), Peatent pure blue (product by Sumitomo-mikuni kagaku), Crystal violet, Brilliant green, Ethyl violet, Methyl green, Basic fuchsine, Malachite green, Oil red, m-Cresol purple, Rhodamine B, Auramine, 4-p-Diethylaminophenyliminonaphthoquinone and Cyano-p-diethylaminophenylacetoanilide; diphenylmethane dyes; oxazine dyes; xanthane dyes; iminonaphthoquinone dyes; azomethine dyes and anthraquinone dyes.

The dye is contained in the photosensitive composition usually in an amount of 0.5 to 10% by weight, preferabl 1 to 5% by weight.

The coating aid includes alkylethers such as ethylcellulose and methylcellulose, fluorine-containing surfactants and nonionic surfactants such as Plulonic L64 (product by Asahi Denka). The plasticizer which is used for the purpose of providing flexibility and abrasion-proof to the coating layer includes butyl phthalate, polyethylene glycol, tributyl citrate, diethyl phthalate, dihexyl phthalate, dioctyl phthalate, 2-ethylhexyl phthalate, tricresyl phosphate, tributyl phosphate, trioctyl phosphate, tetrahydrofurfuryl oleate and oligomer of acrylic acid or methacrylic acid. An ink receptivity-increasing agent which is used for enhancing ink receptivity of an image area includes an alcoholic half-ester of stylene-anhydrous maleic acid copolymer described in JP-A 55-527 (1980). Examples of a stabilizer include polyacrylic acid, tartaric acid, phosphoric acid, phosphorous acid and organic acids (acrylic acid, methacrylic acid, citric acid, oxalic acid, benzenesulfonic acid, naphthalenesuofonic acid and 4-methoxy-2-hydroxybenzophenone-5-sulfonic acid). The addition amount of these compounds is preferably 0.01 to 30% by weight.

Among the negative-working photosensitive compositions, those containing a photopolymerizing compound wil be explained as below. The photopolymerizing compound refers to a compound containing, within the molecule, at least one ethylenic unsaturated double bond capable of addition-polymerization. As examples thereof are cited diethylene glycol di(metha)acrylate, triethyleneglycol di(metha)acrylate, trimethylol propane tri(metha)acrylate, pentaerythritol triacrylate, hydroquinone di(metha)acrylate, pyrogallol triacrylate and 2,2'-bis(4-acryloxydiethoxyphenyl)propane. The ethylenic compound is contained in an amount of 5 to 70% by weight, preferably 10 to 50% by weight, based on the total solid photosensitive composition.

The ethylenic compound is used in combination with an alkali-soluble resin as a binder. This resin is preferably a vinyl copolymer having a structure unit containing a phenolic hydroxy group in the molecule, which has been explained as a resin used in combination with a o-naphthoquinonediazido compound or diazo compound. The vinyl copolymer is contained in an amount of 30 to 70% by weight, preferably 40 to 50% by weight, based on the total solid photosensitive composition. Further, a photopolymerization initiator may be incorporated in the photosensitive layer. Examples thereof include benzoin, benzoin alkylether, benzophenone, anthraquinone, Michler's ketone, trihalomethyl-s-triazine compound, oxadiazole compound, composite of biimidazole and Michler's ketone and composite of thioxanthone and an aromatic tertiary amine.

The photopolymerization initiator used in the present invention is contained in an amount of 0.5 to 30% by weight, preferably 2 to 10% by weight, based on the total solid photosensitive composition. The diazonium resin is contained in an amount of 1 to 20% by weight, prefrably 2 to 10% by weight, based on the total solid photosensitive composition.

In the present invention, the above-described photosensitive composition is dissolved in an appropriate solvent including cellosolves such as methyl cellosolve, ethyl cellosolve, methyl cellosolve acetate and ethyl cellosolve acetate, methylethyl ketone, ethyl acetate, benzyl alcohol, diacetone alcohol, dimethylformaldehyde, dimethylsulfoxide, dioxane, acetone, cyclohexane and trichloroethylene to obtain a photosensitive solution. This solution is coated on a support and dried to obtain a presensitized lithographic printing plate.

Coating is made by methods known in the art such as rotary coating, wire-bar coating, dip-coating, air-knife coating, roller coating, blade coating and curtain coating. The coating amount is, depending on the use thereof, preferably 0.15 to 10 g as solid per m$^2$ of the presensitized lithographic printing plate.

The ablatable light-shielding layer provided in the presensitized lithographic printing plate of the present invention has to have capabilities of absorbing light having a first wavelength such as laser, absorbing a light having a second wavelength to which the photosensitive layer responds and being dissolved-out in a developer with a nonimage area of the photosensitive layer.

To satisfy these capabilities, the light-shielding layer preferably contains a water-soluble or aqueous alkali-soluble resin as a main component. The water-soluble resin refers to a polymer compound having a solubility in water of not less than 1 g per 100 g of water. The word, "aqueous alkali-soluble" refers to a solubility in an aqueous alkaline solution having a pH of 7 to 14 being not less than 1 g per 100 g of the solution.

Examples of the water-soluble resin include gelatin, polyvinyl alcohol, water-soluble polyvinyl formal, water-soluble polyvinyl acetal, water-soluble polyvinyl butyral, polyvinyl pyrroridone, water-soluble polyester, water-soluble nylon, polyacrylic acid, water-soluble polyurethane, methyl cellulose and hyroxypropyl cellulose. There may be used a copolymer containing a monomer constituting the above-described resins. Further, as the water-soluble resin is usable an ionomer resin and an ionic bond-containing resin which comprises, as a co-polymerising component, a sulfo-substituted stylene, acrylic acid, methacrylic acid or anhydrous phthalic acid and further contains a counter ion such as $Na^+$, $K^+$, $Ca^+$, $Zn^+$ or $NH_4^+$. These resin is preferably contained in an amount of 20 to 80% by weight, based on the light-shielding layer.

As the aqueous alkali-soluble resin, there are usable various kinds of resins known in the art, and particularly, novolak resin and vinyl polymer having a structure unit containing a phenolic hydroxyl group are preferable. As examples thereof are cited the same ones as described in the explanation of the photosensitive layer.

The light-shielding layer preferably contains a near-infrared absorbing dye for absorbing high intensity laser light. As the near infrared absorbing dye, particularly in the case when exposed to the laser light having a wavelength in a range of red to near-infrared, there can be used dyes described in Japanese Patent Application No. 4-334584 (1992), page 7, and further cyanine dyes, squalinium dyes, croconium dyes, azulenium dyes, phthalocyanine dyes, naphthalocyanine dyes, anthraquinone dyes, dithiol metal complex dyes, indoaniline metal complex dyes, intermolecular charge transfer complex dyes, transition metal complex dyes and aluminum diinmonium dyes selected from the near-infrared dyes described in "Kinozairyo (Functional materials)", June, 1990, pages 64–68 and dyes used for photo-recording described in "Shikizai (Color materials)" Vol. 61, page 218–223 (1988).

In the case where the light-shielding layer contains the water-soluble resin, the light absorbing material is also preferably water-soluble and more preferably, a tricarbocyanine dye having a water-soubilizing group such as a sulfo group.

In the case of the light-shielding layer containing the water-soluble resin, a water-soluble near-infrared absorptive dye is preferably used as a light-heat converting substance which plays a role in converting light into heat. The water-soluble near-infrared absorptive dye has preferably an acid group such as a sulfo group, carboxyl group or phosphono group, more preferably a sulfo group. The water-soluble near-infrared absorbing dye is preferably one represented by the following formulas (13) and (24).

Formula (13)

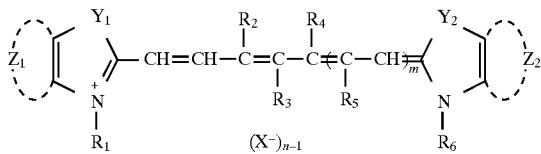

Formula (14)

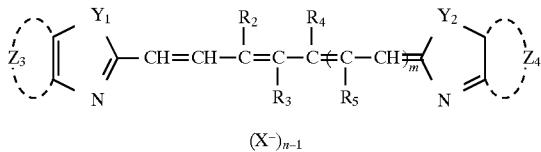

In formulas (13) and (14), $Z_1$ and $Z_2$ each represent an atomic group necessary to form a substituted or unsubstituted pyridine ring, a substituted or unsubstituted quinoline ring, a substituted or unsubstituted benzene ring or a substituted or unsubstituted naphthalene ring; (a $=N^+(R_1)-$ bond or a $-N(R_6)-$ bond may be contained in $Z_1$ or $Z_2$ when $Z_1$ or $Z_2$ represents a pyridine ring or a quinoline ring).

$Z_3$ and $Z_4$ each represent an atomic group necessary to form a substituted or unsubstituted quinoline ring or a substituted or unsubstituted pyridine ring, and may contain in the ring of $Z_3$ and $Z_4$ a $=N^+(R_1)-$ bond or a $-N(R_6)-$ bond.

$Y_1$ and $Y_2$ each represent a dialkyl-substituted carbon atom, a vinylene group, an oxygen, sulfur or selenium atom, or a nitrogen atom bonded with a substituted or unsubstituted alkyl or aryl group.

$R_1$ and $R_6$ each represent a substituted or unsubstituted alkyl group; $R_2$, $R_4$ and $R_5$ each represent a hydrogen atom, a substituted or unsubstituted alkyl group; $R_3$ represents a hydrogen atom, a halogen atom, a substituted or unsubstituted alkyl group, or a substituted or unsubstituted aryl group or a nitrogen atom bonded with an alkyl or aryl group.

But at least one of the groups represented by $Z_1$ to $Z_4$ and $R_1$ to $R_6$ is substituted by at least one of sulfo, carboxyl and phosphono groups (preferably sulfo group).

$X^-$ represents an anion; m represents 0 or 1; n represents an integer of 1 or 2, provided that n is 1 when the dye forms an inner salt.

Formula (15)

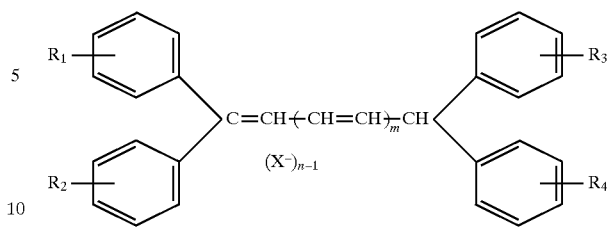

In the formula, $R_1$, $R_2$, $R_3$ and $R_4$ each represent a substituted or unsubstituted alkyl group, $-N(R_5)(R_6)$, $=N^+(R_5)(R_6)$ or a sulfo group; $R_5$ and $R_6$ each represent a substituted or unsubstituted alkyl group, provided that at least one of the groups represented by $R_1$ to $R_6$ is substituted by at least one of sulfo, carboxyl and phosphono groups (preferably sulfo group); $X^-$ represents an anion.

Formula (16)

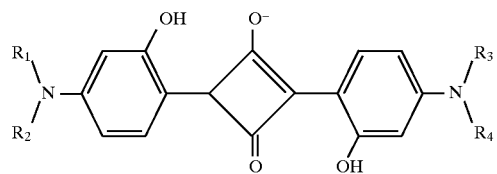

In the formula, $R_1$, $R_2$, $R_3$ and $R_4$ each represent a substituted or unsubstituted alkyl group, and at least one of them is substituted by at least one of the acid groups of sulfo, carboxyl and phosphono groups (preferably sulfo group).

Formula (17)

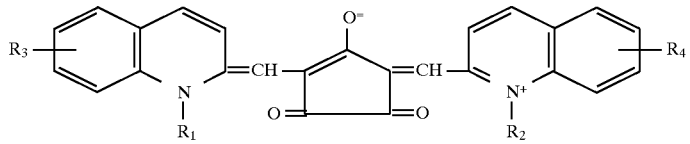

In the formula, $R_1$ and $R_2$ each represent a substituted or unsubstituted alkyl group, at least one of which is substituted by at least one of the acid groups of sulfo, carboxyl and phosphono groups (preferably sulfo group); $R_3$ and $R_4$ each represent a hydrogen atom or an alkyl group which may be substituted by one of the acid groups of sulfo, carboxyl and phosphono groups (preferably sulfo group).

Formula (18)

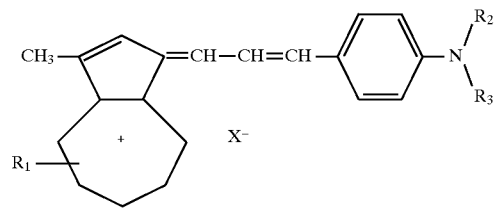

In the formula, $R_1$, $R_2$ and $R_3$ each represent a substituted or unsubstituted alkyl group, at least one of which is substituted by at least one of the acid groups of sulfo, carboxyl and phosphono groups(preferably sulfo group); $X^-$ represents an anion.

Formula (19)

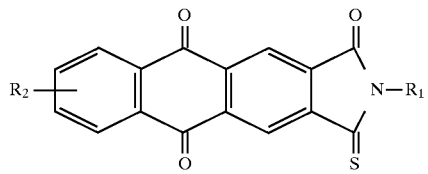

In the formula, $R_1$ and $R_2$ each represent a sulfo, carboxyl or phosphono group, or an alkyl or aryl group substituted with one of such acid groups.

Formula (20)

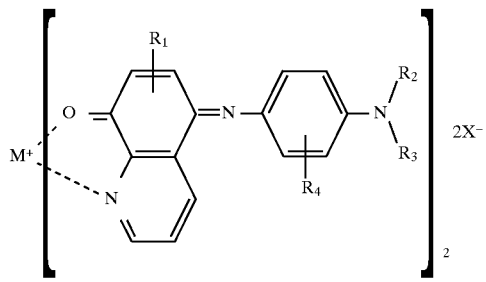

In the formula, $R_1$ represents a hydrogen atom, an amido, amino, alkyl, sulfo, carboxyl or phosphono group, or an alkyl group substituted by one of such groups; $R_2$ and $R_3$ each represent an alkyl group or an alkyl group substituted by at least one of sulfo, carboxyl and phosphono groups; $R_4$ represents a hydrogen atom, a sulfo, carboxyl or phosphono group, or an alkyl group substituted by one of these groups; M represents a metal atom (preferably Cu or Ni); $X^-$ represents an anion.

Formula (21)

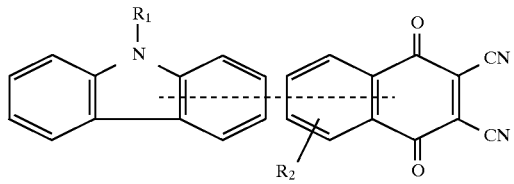

In the formula, $R_1$ represents a hydrogen atom or an alkyl group substituted by one of sulfo, carboxyl and phosphono groups; $R_2$ represents an alkyl, amido, nitro, sulfo, carboxyl or phosphono group.

Formula (22)

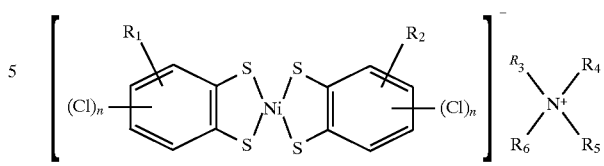

In the formula, $R_1$ and $R_2$ each represent a sulfo, carboxyl or phosphono group or an alkyl group substituted by one of these groups; n represents 2 or 3; $R_3$, $R_4$, $R_5$ and $R_6$, which may be the same or different, each represent an alkyl group.

Formula (23)

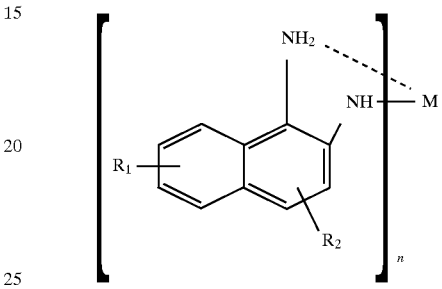

In the formula, $R_1$ and $R_2$ each represent a hydrogen atom, a sulfo, carboxyl or phosphono group or an alkyl group substituted by one of them, provided that $R_1$ and $R_2$ are not hydrogen atoms concurrently; M represents a divalent or trivalent metal atom; n represents an integer of 2 or 3.

Formula (24)

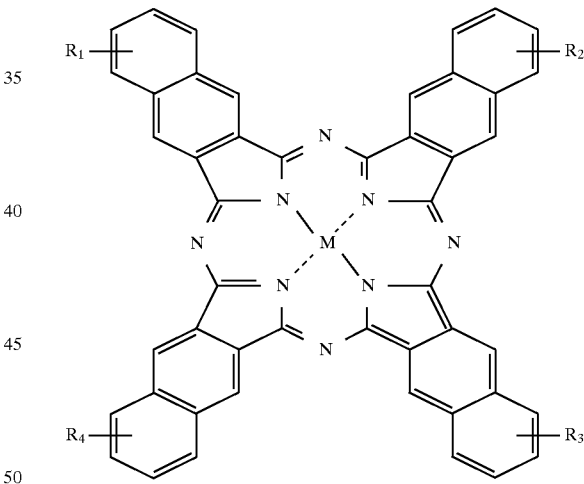

In the formula, $R_1$, $R_2$, $R_3$ and $R_4$ each represent a hydrogen, a sulfo, carboxyl or phosphono group or an alkyl group substituted by one of them, provided that all of $R_1$ to $R_4$ are not hydrogen atoms concurrently; M represents a divalent metal atom.

Typical examples of the compounds represented by formulas (13) to (24) are as follows but not limited to them.

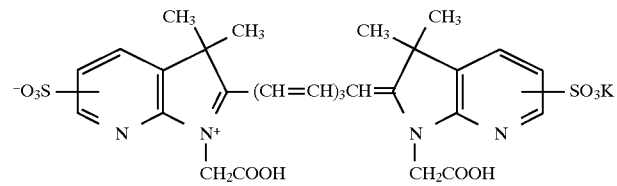

-continued
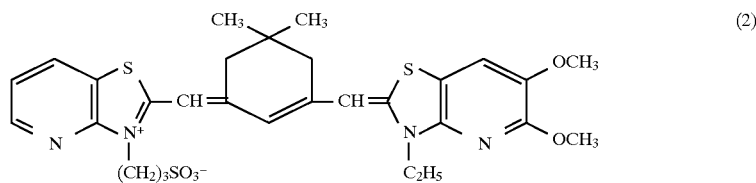
(2)
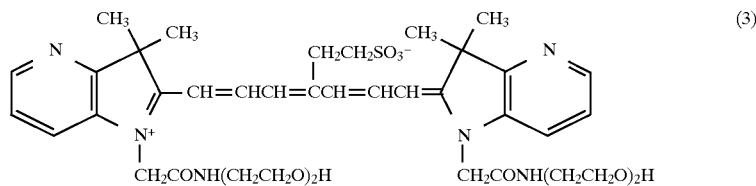
(3)
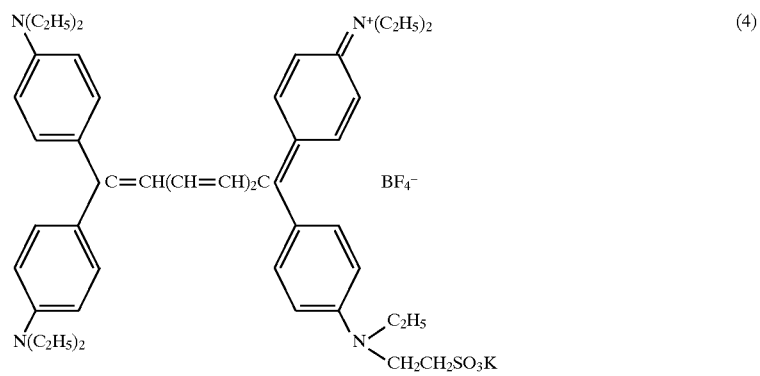
(4)
(5)
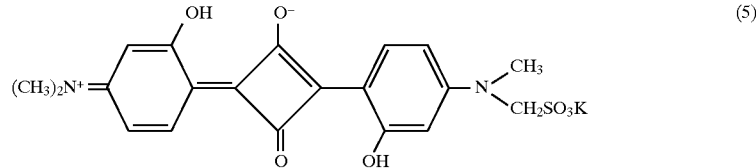
(6)
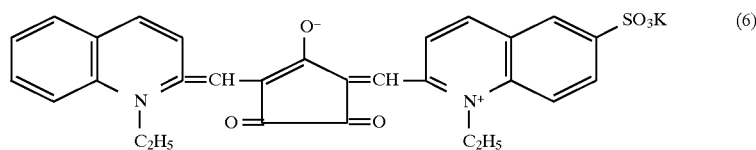
(7)
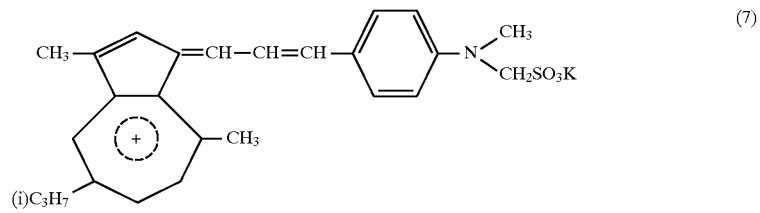
(8)
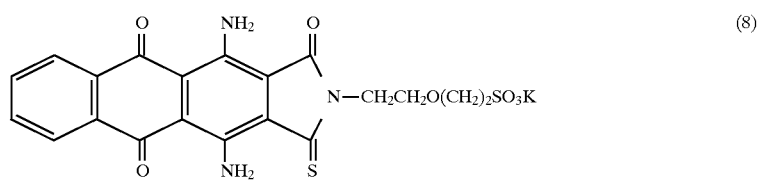

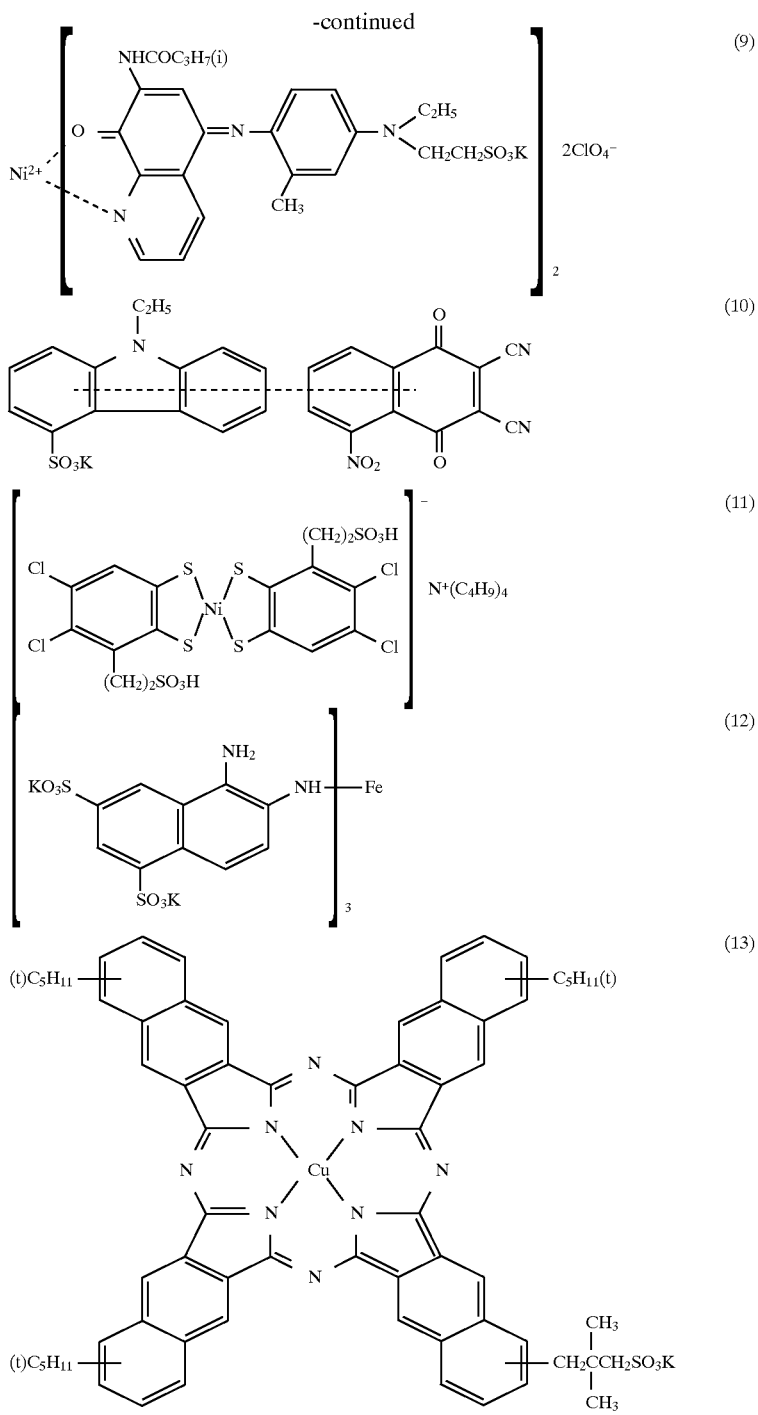

There may be usable near infrared sbsorbing dyes described in JP-A 62-123454 (1987) and 3-146565 (1991). In formulas (13) to (24), there is preferably used a dye which has a substituent including a sulfo group, carboxyl group and phosphono group.

Among these dyes, those which are soluble in an organic solvent may be dispersed, with a high boiling solvent, in the water-soluble resin as colloidal particles. An organic pigment which is insoluble in water and an organic solvent may be dispersed in the water-soluble resin by using an appropriate dispersing agent or surfactant. As the dispersing agent and surfactant, there can be used materials known in the art.

Examples thereof include an alkylamine phosphate, alkylpyridinium chloride, alkylpolyether sulfate, alkylallylsulfonate, alkylbenzenesulfonate, alkylnaphthalenesulfonate, alkylphenolpolyethylene ether, condensate of allylsulfonic acid, higher alcohol sulfonic acid sodium salt, dialkylsulfosuccinate, sulfuric acid ester of an aliphatic acid amide derivative, hydrophobic polyester, cellulose glycolsorbitanmonostearate, cetylalcohol sulfuric acid ester sodium salt, sorbitan alkylate, sorbitan ester quaternary ammonium salt, trimethylstearylammonium chloride, naphthalenesulfonic acid condensate, naphthaleneformalin condensate dinaphthylmetasulfonate, sulfonated caster oil, bisnaphthalenesulfonate, polyoxyethylene alkyl ether, polyoxyethylene alkylallyl ether, polyoxyethylene sorbitanalkyl ether, polyoxyethylene alkylamide, polyoxyethylene alkylamine, polyethylene glycol oleyl ether, polyethylene glycol ester, polyethylene glycol alkylallyl ether sodium sulfonate and polyethylene alkylphenol ether. Furthermore, as more conctrete examples, are cited sodium oleate, sodium rosinate, sodium lauryl sulfate, sodium alkylmonoglyceride sulfate, sodium dodecylbenzenesulfonate, sodium isopropylnaphthalene-sulfonate, sodium monobutylphenylphenoldisulfonate, sodium dibutyl phenylphenoldisulfonate, sodium diisobutylsulfo-succinate, sodium petroleum hydrocarbon sulfonate, turkey red oil, zinc naphthenate, cupper oleate, ammonium alkylbenzenesulfonate, petroleum alkylsulfuric acid ester, sodium dioctylsulfosuccinate, triethanolamine oleic acid soap, sodium dinaphthylmethanesulfonate, sorbitan monolaurate, sorbitan trioleate, polyoxyethylene sorbitan monooleate, polyoxyethylene glycol dioleate, pentaerythritol monooleate, sorbitan sesquioleate, polyoxyethylene oleylphosphate, lecithin, ethylenediamine, triethyamine and triethanolamine.

As a method for dipersing an oil-soluble dye in the water-soluble resin, there can be applied various methods including an aqueous alkaline solution dispersion method, solid dispersion method, latex dispersion method and oil-in-water type emulsion-dispersing method. These can be optionally used in accordance with the chemical structure of the oil-soluble dye. In the present invention, the oil-in-water type emulsion dispersing method, solid particle dispersion method and latex dispersion method are particularly effective. The methods have been known in the art. With regard to the oil-in-water dispersion method, there can be applied a method known as a technique for dispersing a hydrophobic material such as a photographic coupler, as described in JP-A 59-109055. For example, it is conducted in such a manner that the oil soluble dye is dissolved in a high boiling solvent such as N-n-butylacetianilide, diethyllauramide, dibutylphthalate, tricresyl phosphate or N-dodecylpyrrolidone and finely dispersed in a hydrophilic colloid such as gelatin.

The dye is dissolved in a high boiling solvent havin a boiling point of 175° C. or more, which is optionally used in combination with a low boiling solvent and finely dispersed in an aqueous solution of a hydrophilic binder such as gelatin with the use of a surfactant. The resulting dispersion is incorporated in a hydrophilic colloidal layer. As the high boiling solvent are usable organic acid amides; carbamates; esters; ketones; urea derivatives; specifically, phthalic acid esters such as dimethyl phthalate, diethyl phthalate, dipropyl phthalate, dibutyl phthalate, di-n-octyl phthalate, diisooctyl phthalate, diamyl phthalate, dinonyl phthalate and diisodecyl phthalate; phosphoric acid esters such as tricresyl phosphate, triphenyl phosphate, tri-(2-ethylhexyl) phosphate and triisononyl phosphate; sebacic acid esters such as diocty cebacate and di-(2-ethylhexy cebacate; glycerin esters such as glycerol tripropionate and glycerol tributylate; esters of adipic acid, glutaric acid, maleic acid fumaric acid and citric acid. The oil soluble dye is also dissolved in the high boiling solvent and a low boiling solvent optionally selected from methyl acetate, ethyl acetate, propyl acetate, butyl acetate, butyl propionate, cyclohexanol, cyclohexane, tetrahydrofuran, methyl alcohol, ethyl alcohol, acetonitrile, dimethylformamide, dioxane, methylethylketone, methylisobutylketone, diethylketone, diethylene glycol monoacetate, acetylacetone, nitromethane, carbon tetrachloride, and chloroform (these high boiling or low boiling solvents are used singly or in combination thereof); the resulting solution is mixed with an aqueous solution containing a hydrophilic binder such as gelatin which further contains an anionic surfactant such as alkylbenzenesulfonic acid or alkylnaphthalenesulfonic acid and/or a nonionic surfactant such as sorbitan sesquioleic acid ester or sorbitan monolauric acid ester and dispersed with the use of a high-speed mixer, colloid mill or ultrasonic dispersion machine to obtain an emulsified dispersion, which may be incorporated in a hydrophilic colloid.

With regard to the solid particle dispersion method, there can be applied a technique as described in JP-A 3-296045. The solid dispersion method includes a precipitation method and mechanical grinding method. As the precipitation method, there are available a method in which the oil soluble dye is dissolved in an organic solvent and added in water to be dispersed, and a method in which the dye is dissolved in a water-inmiscible, low boiling solvent to form a oil-in-water dispersion and then the solvent is removed by evaporation. With regard to the mechanical grinding method, there is availble a method in which the oil soluble dye is reduced to fine powder by means of high energy such as ultrasonic and the powder is dispersed in a hydrophilic colloid and a method in which the dye is wetted, in the presence of a dispersing agent, with water or poor solvent and then dispersed in the form of fine particles using a mill. As a apparatus for performing the soilid particle dispersion used in the present invention, ball mill, roll mill and sand mill are available. Among these is preferable the sand mill, which is commercially available.

Materials employed as a medium in the mill include glass, alumina, zirconia, agate, stainless and nylon. Among these, are preferable glass, zirconia and alumina. The glass contains preferably silicon dioxide in an amount of not less than 60% by weight. The medium is preferably sphere, having a particle size of 0.1 to 20 mm, preferably 0.5 to 5 mm in diameter. As an example of the glass medium is cited Bright glass beads (product by Bright Kogyo Co., Ltd.).

The latex dispersion method is referred to JP-A 49-74538, 51-59943, 54-32552 and Reaearch Disclosure No. 14850 page 77–79 (Aug., 1976).

The ablatable light-shielding layer of the presensitized lithographic printing plate of the present invention contains the near-infrared absorbing dye preferably in an amount of 1 to 50% by weight. The near-infrared absorbing dye may be in more amounts, unless lowered in the shielding ability of the light-shielding layer.

The light-shielding layer preferably contains a substance capable of absorbing light in a wavelength range, to which the photosensitive layer responds photochemically. Thus, the substance is capable of absorbing the second wavelength. The substance is selected optionally in accordance with the photosensitive layer. The photosensitive wavelength of the diazonium resin or naphthoquinone photosensitive material is in a range of 300 to 500 nm. As substancess capable of absorbing the light in this range, are cited inorganic pigments such as carbon black, cadmium yellow, cadmium red titanium yellow, chrome yellow, zinc yellow, barium chromate, yellow iron oxide and red iron oxide; organic pigments such as hanza yellow and hanza yellow 10G; water-soluble dye such as tartrazine; benzotriazole UV-absorbents such as 2-(2-hydroxyphenyl)bezotriazole; benzophenone UV absorbent such as 2, 4-hydroxybenzophenone and metal fine particles dispersion dispersed in water in a colloidal form colloid such as coloidal silver, cadmium yellow, cadmium red titanium yellow, chrome yellow, zinc yellow, barium chromate, yellow iron oxide and red iron oxide; organic pigments such as hanza yellow and hanza yellow 10G; water-soluble dye such as tartrazine; benzotriazole UV-absorbents such as 2-(2-hydroxyphenyl)bezotriazole; benzophenone UV absorbent such as 2,4-hydroxybenzophenone and metal fine particles dispersion dispersedin water in a colloidal form colloid such as coloidal silver.

Since a water soluble resin is used in the light-shielding layer, if the substance capable of absorbing light having a photosensitive wavelength of the photosensitive layer is water soluble, a coating solution can be readily prepared. However, a material which is oil-soluble or insoluble in water and solvent may be dispersed in the water-soluble resin in a manner similar to the case of the near-infrared absorptive dyes afore-described.

The substance capable of absorbing the photosensitive wavelength of the photosensitive layer may be used singly or in combination thereof. The proportion of the substance capable of absorbing the photosensitive wavelength of the photosensitive layer contained in the light-shielding layer is preferably 5 to 60% by weight. It is preferable to adjust a transmission density of the light-shielding layer so as to have a density of 2 or more at the centered wavelength of the photosensitive wavelengths.

The light-shielding layer may further contain a coating aid such as a surfactant, an antistatic agent such as a conductive compound or an anti-blocking agent such as a mold lublicant or matting agent.

The thickness of the light-shielding layer is preferably as thinner as possible. It is preferably in a range of 0.1 to 2.0 $\mu$m, more preferably 0.1 to 1.0 $\mu$m. If high intensity exposure is made, a thick layer may be ablatable so that the thickness is not necessarily limited to the above-value.

The light-shielding layer may be comprised of plural layers having different functions. As the function is cited light-shielding ability, light absorptivity and anti-blocking property. These functions can be shared with plural layers. The light-shielding layer can be coated in a manner similar to the case of the photosensitive layer.

In the present invention, another layer may be provided in addition to the photosensitive layer and ablatable light-shielding layer. A subbing layer, for example, may be provided between the support and photosensitive layer so as to enhance adhesive property. A backing layer may be provided on the backing side of the support for the purpose of providing transporting stability and antiabration. The thickness of the backing layer is preferably 0.1 to 1 $\mu$m.

An interlayer may be provided between the photosensitive layer and light-shielding layer.

The interlayer has desirably such charactristics that (i) it is transparent to the photosensitive wavelength range of the photosensitive layer; (ii) soluble or capable of being swollen in water or aqueous alkaline solution; and (iii) prevents the high intensity light-absorptive material or photosensitive wavelength-absorptive material from diffusive migration to an adjacent layer during or after manufacturing.

To satisfy the above-described requirements, the interlayer is preferably comprised of the following polymer binder. Thus, in the case where a binder contained in the light-shielding layer provided on the interlayer is a water-soluble resin, the interlayer is mainly comprised preferably of a hydrophobic resin soluble in an aqueous alkaline solution. In the case when the binder is a hydrophobic resin soluble in an aqueous alkaline solution, on the other hand, the interlayer is mainly comprised preferably of a water soluble resin.

As examples of the water soluble resin and hydrophobic resin soluble in an aqueous alkaline solution are cited the same resins as used in the light-shielding layer afore-described.

The thickness of the interlayer is preferably 0.1 to 10 $\mu$m, more preferably 0.5 to 5 mm.

The ablatable light-shielding layer of the present invention may be separated into a light-heat converting layer and a light-shielding layer.

With respect to the case where the ablatable light-shielding layer is comprised of a light-heat converting layer and a light-shielding layer, it will be explained as below.

The light-heat converting layer is characterized in that it absorbs at least 80% of the light having a first wavelength of 500 nm or more. The absorbed wavelength is preferably in a range of 700 to 1200 nm and the absorption ratio is preferably 90% or more. The thickness of the layer is 1 mm or less, more preferably 0.01 to 0.5 mm.

The light-heat converting layer itself is not necessarily destroyed by laser light. Even if the light-heat converting layer is still remained, it is preferable that an ultraviolet radiation (thus, light having a second wavelength) reaches a lower photosensitive layer. Accordingly, the absorption ratio of the light-heat converting layer is preferably less than 30% with respect to the light having the second wavelength.

The light-heat converting layer is formed by mixing a water soluble resin and a dye (preferably, infrared-absorbing dye), and coating the mixture on the photosensitive layer. Therefore,the composition of the coating solution is preferably one which does not dissolve the lower layer during coating.

The infrared absorbing dye used in the present invention refers to the dye having a molar absorption coefficient of 10,000 or more in an appropriate medium with respect to a light having a wavelength in a range of 700 to 1200 nm (visible light or infrared light). The infrared absorbing dye is contained preferably in an amount of 10% by weight.

In the case where the first wavelength for ablating exposure is in a visible light region, there can be used various kinds of pigments and dyes which are capable of absorbing the exposing light wavelength. In the case where the first wavelength is in a range of red to near-infrared, dyes described in Japanese Patent Application 4-334584 at page 7 and carbon black are usable. There are also usable cyanine dyes, squalinium dyes, croconium dyes, azulenium dyes, phthalocyanine dyes, naphthalocyanine dyes, anthraquinone dyes, dithiol metal complex dyes, indoaniline metal complex dyes, intermolecular charge transfer complex dyes, transition metal complex dyes and aluminum diinmonium dyes selected from the near-infrared dyes described in "Kinozairyo (Functional materials)", June, 1990, pages 64–68 and dyes used for photo-recording described in "Shikizai (Color materials)" Vol. 61, page 218–223 (1988).

The water soluble resin is preferably used in the light-heat converting layer so that the dye is preferably water soluble, particularly preferably a tricarbocyanine dye a water-solubilizing substituent such as a sulfo group. The water soluble, infrared-absorbing dye preferably has an acid group such as a sulfo group (—SO$_3$H), carboxy group (—COOH) or phosphono group (—PO$_3$H$_2$), more preferably a sulfono group. The word, "water soluble" refers to "being soluble in water at 25° C. in an amount of 1% or more".

The light-shielding layer has preferably an absorption ratio of 97% or more, more preferably 99% or more with respect to the second wavelength of less than 500 nm, so that a UV-absorbing dye is preferably contained in an amount of 10% by weight or more. The dye is optionally selected in accordance with the photosensitive layer. The photosensitive wavelength of the photosensitive diazo resin or naphthoquinone is in a range of 300 to 500 nm so that, as materials capable of absorbing the light in this wavelength range, are cited cadmium yellow, cadmium red, titanium yellow, chrome yellow, zinc yellow, barium chromate, yellow iron oxide and red iron oxide; organic pigments such as hanza yellow and hanza yellow 10G; water-soluble dye such as tartrazine; benzotriazole UV-absorbents such as 2-(2-hydroxyphenyl)bezotriazole; benzophenone UV absorbent such as 2,4-hydroxybenzophenone and metal fine particles dispersion dispersed in water in a colloidal form such as coloida silver.

In the case where the heat-generating position is located at a lower portion of the light-shielding layer, the absorbing ratio of the layer with respect to the light having the first wavelength is preferably smaller, concretely 30% or less.

Next, a method for preparing a lithographic printing plate of the present invention will be explained, based on the drawings. FIG. 1 is schematic illustrations showing a process of preparing the lithographic printing plate by using a presensitized lithographic printing plate. FIG. 1(a) shows the structure of the presensitized lithographic printing plate, in which 2 is an aluminum support; 3, grains provided on the surface of the support 2; 4, a negative-workingphotosensitive layer coated on the grains 3; and 5, an ablatable light-shielding layer coated on the photosensitive layer 4. When, as shown in FIG. 1(b), the presensitized plate is exposed to laser light 6 from the side of the light-shielding layer, the light-shielding layer 5 is imagewise ablated, as shown in FIG. 1(c). Subsequently, the presensitized plate is exposed overall to actinic ray 7 responsive to the photosensitive layer 4 to make a portion of the photosensitive layer 4 which has been removed by ablation, insoluble in a developer. Then, as shown in FIG. 1(d), another portion of the photosensitive layer which is soluble in the developer is removed. In case of a positive-working photosensitive layer, after exposed to the laser light and the actinic ray, a portion of the photosensitive layer which has been ablatively removed by the laser-exposure is made soluble in the developer. Thereafter, the portion of the photosensitive layer which has been laser-exposed is dissolved out in the developer during development and the light-shielding layer laser-unexposed is also dissolved out, so that only a laser-unexposed portion of the photosensitive layer is remained on the support to obtain an imagewise formed lithographic printing plate.

Thus, an imaging proces of the invention comprises a step of exposing, to a high intensity light, the side of a ablatable light-shielding layer of a recording material to ablate imagewise the light-shielding layer and a step of exposing the ablated recording material overall to an actinic ray and a step of liquid-developing.

As a laser light source for high intensity exposure, are available a semiconductor laser, He-Ne laser, Ar laser. YAG laser and $CO_2$ laser. The semiconductor laser is preferable in view of handling.

An exposure power density in the focal surface is preferably 100000 W/cm$^2$ or more, more preferably 200000 w/cm$^2$. At a lesser power density, the ablatable light-shielding layer is often not ablated effectively. An exposing speed is preferably 0.4 m/sec. or more, further preferably 1 m/sec. or less. At a slower exposing speed, another layer, besides the light-shielding layer, may be affected.

Examples of preferable exposure condition are shown as below, but the present invention is not limited thereto.

| Output power (mW) | Optical Efficiency (%) | Exposing spot Diameter (μm) | Focal surface power (W/cm$^2$) |
|---|---|---|---|
| 100 | 50 | 6 | 177000 |
| 150 | 70 | 10 | 134000 |
| 500 | 50 | 10 | 318000 |
| 2000 | 30 | 10 | 764000 |

Holes formed by high intensity exposure may be in a dot form or linked holes. In this case, the image is formed in accordance with the form of ablated holes of the light-shielding layer to become dots or solid. In the case of the dot, the more is the number of the dots, higher is an image density. (The image density is proportional to the number of the dots.)

The presensitized lithographic printing plate of the present invention comprises the photosensitive layer provided thereon with the ablatable light-shielding layer so that the presensitized plate is superior in storage stability and it is not needed to work under safe light.

With regard to the actinic ray source for exposing overall the presensitized plate in which the light-shielding layer has been imagewise ablated, it is preferable that a light source has a spectral energy distribution in response to the spectral sensitivity of the photosensitive layer. A high pressure or ultra-high pressure mercury lamp and metahalide lamp are well suited for the diazonium resin or naphthoquinone photosensitive material.

In the method for preparing the lithographic printing plate of the invnetion, the use of laser light for ablating the light-shielding layer enables high definition recording. Accurate reproduction of continuous tone of an image can be made in such a manner that an image density tone is reproduced by controlling thermal energy. The use of a dot-generatot enables to provide thermal energy in response to the dot area.

Figure 2:
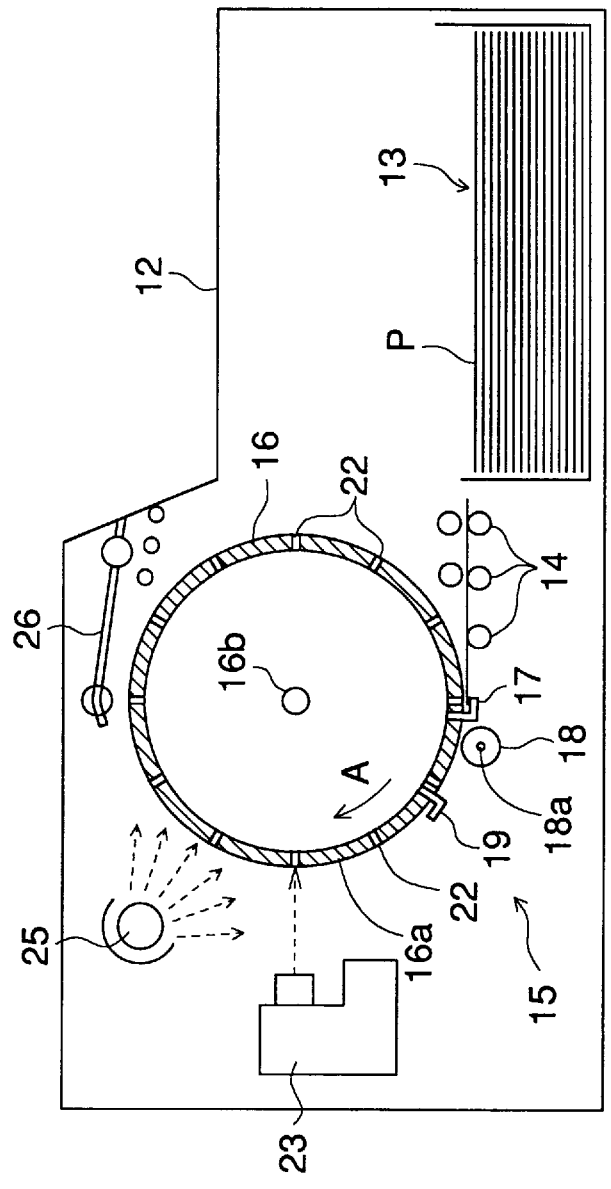
FIG. 2 is a sectional view of an apparatus for exposing a presensitized lithographic printing plate of the present invention.

Next, an exposure unit for a presensitized lithographic printing plate of the invention will be explained as follows, referring to the drawings. FIG. 2 is a cross-sectional view showing an example of the exposure unit for a presensitized lithographic printing plate of the invention. The numeral 12 is an enclosure having therein the exposure unit, and 13 is a feeding means for presensitized lithographic printing plate P. The feeding means 13 is so arranged as to feed out plural presensitized lithographic printing plates P stacked thereon in a way that an unillustrated mechanism feeds out constantly the uppermost presensitized plate successively toward the left-hand side in the figure. The numeral 14 is a conveyance roller that conveys to holding means 15 the presensitized lithographic printing plates P fed out by the feeding means 13. The holding means 15 is mainly composed of holding member 16, presensitized plate mounting means 17, pressure roll 18, presensitized plate ejecting means 19 and an unillustrated pressure-reducing means.

The holding member 16 is mainly composed of a hollow cylinder which can be rotated on its rotation axle of rotary shaft 16b at a predetermined speed of revolution by an unillustrated mechanism, and an external circumferential surface of the hollow cylinder serves as a holding surface 16a for holding presensitized lithographic printing plate P. The holding surface 16a is provided with evacuation holes 22 composed of a great number of slotted holes located at regular intervals each penetrating into the inside of the hollow cylinder, the inside of the hollow cylinder is decompressed by an unillustrated pressure-reducing means, and thereby the presensitized lithographic printing plate P can be sucked through the evacuation holes 22 to be held on the holding surface 16a.

The presensitized plate mounting means 17 is one which sandwiches the presensitized lithographic printing plate P conveyed to a prescribed position on the holding member 16 by conveyance roller 14, between itself and the holding surface 16a.

It sandwiches the leading edge of the presensitized lithographic printing plate P conveyed by the conveyance roller 14 while being supported by an arm (not shown) whose rotation axle is rotary shaft 16b so that the presensitized lithographic printing plate P can be wound around the holding surface 16a by the rotation of the holding member 16 and the arm in the direction of arrow A. Pressure roll 18 is so arranged as to rotate freely on its rotation axle of rotary shaft 18a and to urge the holding surface 16a with appropriate force at a predetermined timing by means of an unillustrated control system. When the leading edge of the presensitized lithographic printing plate P is sandwiched between the holding surface 16a and the presensitized plate mounting means 17, decompression is started, then the presensitized lithographic printing plate P is sucked through evacuation holes 22, and it is wound around the holding surface 16a to be held thereon when the holding member 16 rotates. The pressure roll 18 is urged against the holding surface 16a to bring the presensitized lithographic printing plate P in pressure contact with the holding surface 16a, and when the full surface of the presensitized lithographic printing plate P is held on the holding surface 16a, the pressure roll 18 leaves the holding surface 16a. Presensitized plate ejecting means 19 sandwiches the trailing edge of the presensitized lithographic printing plate P released from suction caused by decompression of holding member 16 and transports it to ejection portion 26. The numeral 23 represents an optical writing means which is a means for conducting selectively highly intensive exposure on the presensitized lithographic printing plate P in accordance with image information, and it is structured so that exposure is conducted in accordance with image information, being controlled by an unillustrated control system known widely. The numeral 25 represents full surface irradiation means that irradiates on an entire plane the active light which causes light response on a light-sensitive layer of the presensitized lithographic printing plate P. The presensitized lithographic printing plate P on which full surface irradiation is finished is caught by its trailing edge by the presensitized plate ejecting means 19 to be transported to ejection portion 26 where a conveyance means constituting the ejection portion 26 ejects the presensitized lithographic printing plate P out of enclosure 12.

Next, operations of an exposure unit shown in FIG. 2 will be explained as follows.

When the uppermost sheet among a plurality of presensitized lithographic printing plates P stacked on feeding means 13 is fed out toward the left side in the figure by an unillustrated mechanism, the sheet is conveyed to holding means 15 by conveyance roller 14. When the leading edge of the presensitized lithographic printing plate P comes in contact with presensitized plate mounting means 17, the presensitized plate mounting means 17 is urged against holding surface 16a, thereby the leading edge portion of the presensitized lithographic printing plate P is sandwiched by the presensitized plate mounting means 17, and concurrently with that, the pressure-reducing means operates and the inside of holding member 16 is decompressed and the holding member 16 is rotated in the direction of arrow A. Next, pressure roll 18 is urged toward holding surface 16a to bring presensitized lithographic printing plate P in pressure contact with the holding surface 16a, thus the presensitized lithographic printing plate P is wound around the holding surface 16a. When the full surface of the presensitized lithographic printing plate P is held on the holding surface 16a, the pressure roll 18 leaves the holding surface 16a, then, holding member 16 starts rotating at high speed while holding the presensitized lithographic printing plate P on the holding surface 16a, exposure is conducted by optical writing means 24 in accordance with image information controlled by an unillustrated control mechanism. After imagewise exposure is completed, the full surface of the presensitized lithographic printing plate P is exposed to active light which causes light response on a light-sensitive layer of the presensitized lithographic printing plate P by means 25 which irradiates on the full surface the active light which causes light response on a light-sensitive layer of the presensitized lithographic printing plate P. After the exposure on the full surface is completed, decompression of holding member 16 is released, then, the trailing edge of the sheet is sandwiched by presensitized plate ejecting means 19 and thereby the presensitized lithographic printing plate P is conveyed to ejection portion 26 by the rotation in the direction of arrow A of both the presensitized plate 19 and the holding member 16 to be ejected out of enclosure 12.

Figure 3:
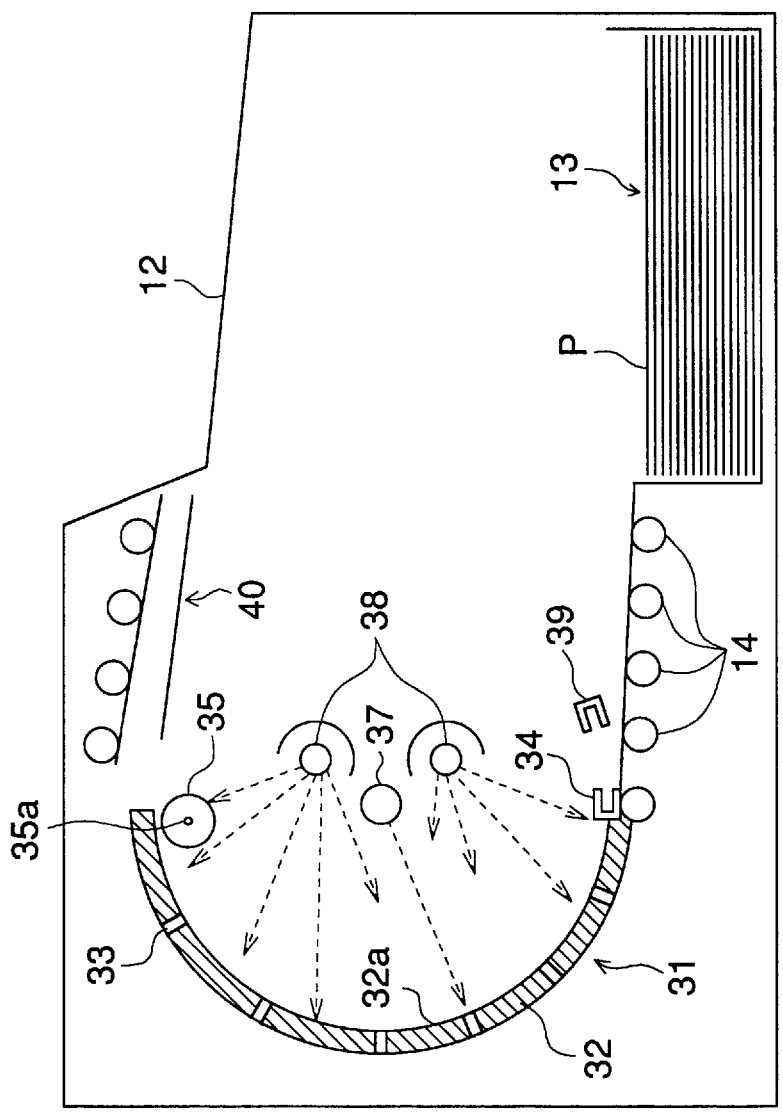
FIG. 3 is another sectional view of an apparatus for exposing a presensitized lithographic printing plate of the present invention.

An optical writing means and a means for irradiation on the full surface may also be provided inside a cylindrical holding member. A sectional view of an example of such exposure unit is shown in FIG. 3. In FIG. 3, the numeral 31 is a holding means for presensitized lithographic printing plate P, and the holding means 31 is mainly composed of holding member 32, presensitized plate mounting means 34 for mounting presensitized lithographic printing plate P on holding surface 32a of the holding member 32, pressure roll 35 and pressure-reducing means (not shown). The holding member 32 is a holding member for presensitized lithographic printing plate P whose semicylindrical internal surface constitutes holding surface 32a that holds presensitized lithographic printing plate P, the numeral 33 is an evacuation hole provided on the holding member 32, and presensitized lithographic printing plate P on the holding surface 32a is sucked through the evacuation hole by an unillustrated pressure-reducing means so that the presensitized lithographic printing plate P comes in pressure contact with the holding surface 32a. The numeral 34 is a presensitized plate mounting means which fixes presensitized lithographic printing plate P on the holding surface 32a, and it is provided at an end portion of a swing of an arm (not shown) whose rotation axle is a center line of semicylindrical surface forming the holding surface 32a, thus, the leading edge of the presensitized lithographic printing plate P conveyed by conveyance roller 14 is sandwiched and the presensitized lithographic printing plate P is rotated up to its top portion along the holding surface 32a by the clockwise rotation of the arm. The numeral 35 is a pressure roll that is arranged to be freely rotatable on its axle of rotary shaft 35a. The rotary shaft 35a is fixed on an arm (not shown) whose rotation axle is a center line of a semicylindrical surface of holding surface 32a, and when the arm rotates, the pressure roll 35 moves along the holding surface 32a while applying pressure on the holding surface 32a. The numeral 37 is an optical writing means which is arranged to conduct sub-scanning in the direction perpendicular to the figure plane and to conduct main scanning on the holding surface 32a in the vertical direction on the figure, so that images are exposed. The numeral 38 is a means for irradiating on the full surface, 39 is a sensitized plate ejecting means, and after completion of irradiation on the full surface, decompression of holding member is released, and presensitized lithographic printing plate P is sandwiched at its trailing edge to be conveyed to ejection portion 40. The ejection portion 40 is composed of conveyance means such as a conveyance roller which ejects presensitized lithographic printing plate P conveyed by presensitized plate ejecting means 39 out of enclosure 12 and a conveyance belt. Other constitution elements identical to those in FIG. 2 are given the same symbols as those in FIG. 2 to omit their explanation.

Next, operations of a unit shown in FIG. 3 will be explained as follows. The uppermost sheet among a plurality of presensitized lithographic printing plates P stacked on feeding means 13 is fed out toward the left side in the figure by the feeding means 13, and when it is conveyed by conveyance roller 14 to a prescribed position on the side of holding means 31, the leading edge of the sheet is caught by presensitized plate mounting means 34 and is lifted along the holding surface 32a up to the top portion thereof. Then, pressure roll 35 presses presensitized lithographic printing plate P against the holding surface 32a in the direction perpendicular to that surface near the top end of the holding surface 32a. Concurrently with this, decompression is started by a pressure-reducing means of holding means 31, then suction is carried out through evacuation hole 19, and almost simultaneously with this, the pressure roll 35 swings toward the bottom end of the holding surface 32a while pressing presensitized lithographic printing plate P, thus, the presensitized lithographic printing plate P is sucked on the holding surface 32a and is held thereon. After that, the pressure roll 35 leaves the holding surface 32a, optical writing means 37 starts rotating at high speed, and thereby exposure is carried out in accordance with image information prepared separately. After completion of image exposure, means for irradiating on the full surface 38 irradiates active light on the full surface, then decompression is released after completion of the irradiation on the full surface, thereby presensitized plate ejecting means 39 sandwiches the trailing edge of presensitized lithographic printing plate P and rotates clockwise in the figure to transport the presensitized lithographic printing plate P to ejection portion 40 where the presensitized lithographic printing plate P is ejected out of enclosure 12.

In the units shown in FIG. 2 and FIG. 3, it is also possible to employ the constitution wherein holding is carried out under the condition that the pressure roll is not pressed against the holding surface. It is preferable that the pressure roll is structured to have a circumferential surface around which an elastic object is wound. Rubber hardness of the elastic object which is not less than 40° is preferable for the pressure roll to come in close contact uniformly, and it is preferable for excellent close contact that line pressure of 1 kg/cm or more is used for pressing the pressure roll. An optical writing means may also be composed of a plurality of lasers. Further, as a conveyance means, any means such as a roller, a belt or the like can be used. In addition, in a unit as that shown in FIG. 2, evacuation holes can also be opened and closed in synchronization with rotation of a holding member when holding.

(Processing)

In the present invention a developer used for processing the presensitized lithographic printing plate (development) and a replenishing solution thereof contain alkali metal silicate. Alkali metals of the silicate include lithium, sodium and potassium, and among these is preferable potassium.

It is preferable that, during the course of the development, a developer replenishing solution is optimally replenished in accordance with the processing amount of the presensitized lithographic printing plate.

The developer and replenishing solution thereof each are preferably an aqueous alkali metal silicate solution having a ratio of $[SiO_2]/[M]$ of 0.5 to 2.0, preferably 0.15 to 1.0 ( in which $[SiO_2]$ is a molarity of $SiO_2$ and [M] is a molarity of an alkali metal) and a $SiO_2$ concentration of 0.5 to 5.0% by weight. More preferably, $[SiO_2]/[M]$ and $SiO_2$ concentration of the developer are 0.25 to 0.75 and 1.0 to 4.0, respectively; and $[SiO_2]/[M]$ and $SiO_2$ concentration of the replenishing solution is 0.15 to 0.50 and 1.0 to 3.0, respectively.

The developer and replenishing solution may contain a water-soluble or alkali-soluble organic or inorganic reducing agent.

Examples of the organic reducing agent include phenols such as hydroquinone, metol and metoquinone; and amine compounds such as phenylenediamine and phenylhydrazine. Examples of the inorganic reducing agent include sulfites such as sodium sulfite, potassium sulfite, ammonium sulfite, sodium hydrogen sulfite, potassium hydrogen sulfite; phosphites such as sodium phosphite, potassium phosphite, sodium hydrogen phosphite, potassium hydrogen phosphite, sodium dihydrogen phosphite, and potassium dihydrogen phosphite; hydrazine, sodium thiosulfate and sodium dithionite. The water-soluble or alkali-soluble reducing agent maybe contained in the developer or replenishing solution in an amount of 0.05 to 10% by weight.

The developer and the replenishing solution thereof may contain an organic carboxylic acid.

The carboxylic acid includes an aliphatic carboxylic acid having 6 to 20 carbon atoms and an aromatic carboxylic acid such as a carboxy-substituted benzene or naphthalene.

The aliphatic carboxylic acid is preferably an alkane acid having 6 to 20 carbon atoms, including caproic acid, enathylic acid, caplyric acid, pelargon acid, capric acid latric acid, myristic acid palmitic acid and stearic acid; more preferably an alkane acid having 6 to 12 carbon atoms. The aliphatic acis may have a double bond or be branched. The aliphatic carboxylic acid above-described may be used as sodium, potassium or ammonium salt.

Examples of the aromatic carboxylic acids include benzoic acid, o-chlorobenzoic acid, p-chlorobenzoic acid, o-hyroxybenzoic cid, p-hydroxybenzoic acid, p-tert-butylbenzoic acid, o-aminobenzoic acid, p-aminobenzoic acid, 2,4-dihydroxybenzoic acid, 2,5-dihydroxybenzoic cid, 2,6-dihydroxybenzoic acid, 2,3-dihydroxybenzoic cid, 3,5-dihydroxybenzoic cid, gallic acid, 1-hydroxy-2-naphthoeic acid, 3-hydroxy-2-naphthoeic acid, 2-hydroxy-1-naphthoeic acid, naphthoeic acid and 2-naphthoeic acid.

The aromatic carboxylic acid may be used as a sodium, potassium or ammonium salt.

The aliphatic or aromatic carboxylic acid is contained in an amount of 0.1 to 30% by weight.

The developer and the replenishing solution thereof may contain a surfactant including an anionic, nonionic or cationic surfactant, or an organic solvent. The developer and replenishing solution thereof may further contain additive known in the art.

EXAMPLES

The method of preparing the lithographic printing plate of the present invention will be explained on the basis of examples thereof, but the embodiment of the present invention is not limited thereto. Hereinafter, the word, "part(s)" refers to weight part(s).

Example 1

Preparation of grained aluminum plate:

An aluminum plate having a thickness of 0.24 mm was dipped in a sodium hydroxide aqueous solution for degreasing, washed and subjected to electrolytic etching for 5 min. in 1% hydrochloric acid aqueous solution at 25° C. and a current density of 3 A/dm². After being washed, the plate was dipped in a 0.9% sodium hydroxide aqueous solution and then washed. Subsequently, the plate was subjected to anodic oxidation for 2 min. in 40% sulfuric acid aqueous solution at 30° C. and a current density of 1.5 A/dm² and washed. The plate was further dipped in a 1% sodium metasilicate aqueous solution at 80° C. over a period of 30 sec. for sealing treatment, washed and dried to obtain an aluminum plate for use as a support of the presensitized lithographic printing plate.

Coating of photosensitive layer coating solution:

On the aluminum plate prepared as above-described, a coating solution of a positive-working photosensitive layer having the following composition was coated with a rotary coating machine. The coating amount of the photosensitive layer (1) was 2.2 g/m².

Positive-working photosensitive layer coating solution (1):

| Novolak resin 1 | 7.0 g |
|---|---|
| o-Naphthoquinonediazide compound (QD1) | 1.4 g |
| Halomethyloxadiazole compound (rad1) | 0.05 g |
| Pictorial pure blue (trade name, dye product by Hodogaya Kagaku) | 0.07 g |
| Methyl cellosolve | 100 ml |

Novolak resin 1: A condensation copolymer of phenol, m-cresol, p-cresol and formaldehyde (molar ratio of phenol, m-cresol and p-cresol, 2.0:4.8:3.2; Mw=6000, Mw/mn=5.0).

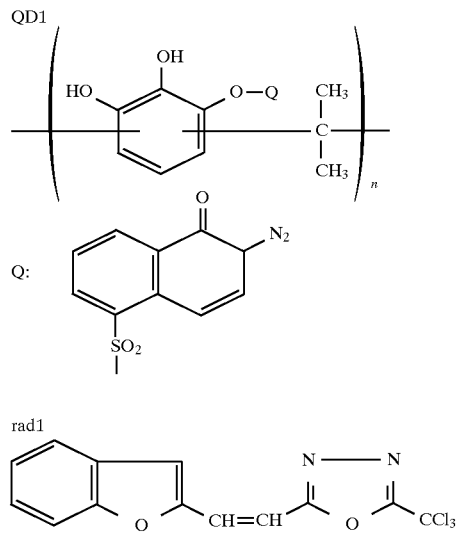

Coating of ablatable light-shielding layer coating solution 1:

On the photosensitive layer above-prepared, a light-shielding layer coating solution 1 containing the following composition was coated using a wire-bar and dried to form an ablatable light-shielding layer (1) having a thickness of 0.5 μm. There was thus obtained a presensitized lithographic printing plate.

Light-shielding layer coating solution 1:

| Gelatin | 2.9 parts |
|---|---|
| Near-infrared absorbing dye (IR-1) | 0.9 parts |
| Colloidal silver | 1.6 parts |
| Water | 94.7 parts |

IR-1

$$\begin{array}{c}\text{structure with two indoline groups connected by } (CH=CH)_3CH= \\ \text{bearing } CH_3 \text{ groups, } N^+, \text{ and } (CH_2)_3SO_3^- / (CH_2)_3SO_3Na \text{ substituents}\end{array}$$

Ablation of ablatable light-shielding layer:

The presensitized lithographic printing plate was exposed to laser beam from semiconductor laser LT090MD (product by Shrap, wavelength of 830 nm, maximum light output of 100 mW). The light-shielding layer was ablated by scanning with a condensed spot having a diameter of 6 μm at a scanning speed of 0.5 m/sec. (Optical efficiency was 60%.) Ablated portions which were in a dot form had a dot size of 6.5 μm in diameter. Further, the laser was modulated through RIP and a pattern exposure was made through a 175-lines screen by changing a dot percentage at intervals of 10% in a range of from 0 to 100%.

The thus pattern-ablated presensitized plate was overall exposed over a period of 70 sec. at 90 cm far apart from a light source of 2 kW metal halide lamp (product by Iwasaki Electric Co., Idlefin 200).

Next, the sample was develpoed at 25° C. for 30 sec. with a developer which was prepared by diluting a developer SDP-1 (product by Konica) by 7 to 9 times. As a result, development was proved to be good.

Further, plate life test was conducted using a sheet-fed press, so that the plate life was shown to be 200,000 sheets, wherein the plate life was referred to as the number of printed sheet at which a printed image became ink-deficient or blurred.

Example 2

A presensitized lithographic printing plate was prepared by coating, on the grained aluminum plate which was the same as used in Example 1, a coating solution of a negative-working photosensitive layer having the following composition in a similar manner to Example 1 to form a photosensitive layer (2) and futher thereon, coating a coating solution of a light-shielding layer in a similar manner to Example 1 to form an ablatable light-shielding layer (2).

Negative-working photosensitive layer coating solution (2):

| Diazonium resin 1 | 1 g |
|---|---|
| Polymer compound 1 | 10 g |
| Polyacrylic acid (Julimer Ac-10L, product by Nihon Junyaku) | 0.6 g |
| Pictorial pure blue BOH (Hodogaya Kagaku) | 0.2 g |
| Methyl cellosolve | 160 g |

Diazonium resin was prepared in the following manner.

p-Diazodiphenylamine sulfate of 14.5 g (50 mmol) was dissolved in concentrated sulfuric acid solution of 40.9 g with ice-cooling. After completing the reaction, para-formaldehyde of 1.5 g (50 mmol) was slowly added dropwise thereto, while being kept at a temperature of 10° C. or lower. The reaction mixture was stirred further for 2 hrs. with ice-cooling. The reaction product was added dropwise to ethanol of 500 ml with ice-cooling and resulting precipitate was separated by filtration. The precipitate was washed with ethnol and dissolved in water of 100 ml. To the aqueous solution was added a cooled, concentrated aqueous solution in which zinc chloride of 6.8 g was dissolved. The resulting precipitate was separated by filtration, washed with ethanol and dissolved in water of 159 ml. To this solution was added a cooled concentrated aqueous solution in which ammonium hexafluorophosphate of 8 g was dissolved. The resuting precipitate was separated by filtration, washed with water and dried at a temperature of 30° C. over a period of one day and night to obtain 1 g of diazonium resin. The resin was subjected to GPC for determining a molecular weight, and it was shown to have a weight-averaged molecular weight of 2400. Polymer compound 1 was prepared in the following manner.

| | |
|---|---|
| N-(4hydroxyphenyl)methacryl amide | 10.3 g |
| Acrylonitrile | 15.9 g |
| Ethyl acrylate | 55 g |
| Methacrylic acid | 8.6 g | and azobisisobutylonirile (AIBN) of 1.6 g were dissolved in 110 ml of a mixed solvent of acetone and methanol in a ration of 1:1 and allowed to be reacted by heating at 60° C. for a period of 8 hrs. under an atmosphere of nitrogen gas. After completion of reaction, the reaction mixture was poured into water of 5 liters. The resuting precipitate (white-colored) was separated by filtration and dried to obtain polymer compound 1 of 75 g. From the melecular weight measurement (GPC), it was shown to have a weight-averaged molecular weight of 92,000.

Next, a coating solution of an ablatable light-shielding layer having the following composition was coated on a photosensitive layer in a similar manner to Example 1.
Light-shielding layer coating solution 2

| | |
|---|---|
| Gelatin | 2.5 parts |
| Near-infrared absorbing dye (IR-1) | 1.2 parts |
| Carbon black aqueous dispersion | 4.3 parts |
| (containing carbon black of 1.2 parts) | |
| (DISPERSE BLACK SD9020 produced by Dainihon Ink Co.,: | |
| carbon blach, 30% and dispersing agent, 10%) | |
| Water | 92 parts |

The thus-obtained presensitized lithographic printing plate was imagewise exposed to laser beam in the same manner as in Example 1, further overall exposed for 45 sec. and developed at 25° C. for 45 sec. with a developer which was prepared by diluting a developer SDN-21 (product by Konica) by 4 times. It was shown that developbility was excellent without print-stain and plate life was 150,000 sheets.

Example 3

On a grained aluminum plate, a coating solution of a negative-working photosensitive layer having the following composition was coated in a similar manner to Example 1 to obtain a photosensitive layer (3).
Negative-working photosensitive composition coating solution (3)

| | |
|---|---|
| Diazonium resin 1 | 0.48 g |
| Polymer compound 2 | 6 g |
| Trimethylolpropanetriacrylate | 6 g |
| Photopolymerization initiator | 0.6 g |

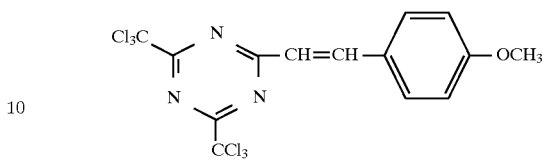

| | |
|---|---|
| Polyacrylate (Julimer Ac-10L produced by Nihon Junyaku) | 0.24 g |
| Pictorial pure blue BOH (product by Hodogaya Kagaku Co.) | 0.24 g |
| Methyl cellosolve | 160 g |

Polymer compound 2 was prepared in the following manner.

| | |
|---|---|
| N-(4hydroxyphenyl)methacryl amide | 35 g |
| Acrylonitrile | 10 g |
| Methyl methaacrylate | 34 g |
| Methacrylic acid | 6 g | and azobisisobutylonirile (AIBN) of 1.2 g were dissolved in 80 ml of a mixed solvent of acetone and methanol in a ratio of 1:1 and allowed to be reacted by heating at 60° C. for a period of 8 hrs. under an atmosphere of nitrogen gas. After completion of the reaction, the reaction mixture was poured into water of 5 liter. The resuting precipitate (white-colored) was separated by filtration and dried to obtain polymer compound 2 of 75 g. From the melecular weight measurement (GPC), it was shown to have a weight-averaged molecular weight of 40,000.

Next, A presensitized lithographic printing plate was prepared by coating the light-shielding layer coating solution 1 afore-described in the same manner as in Example 1 to form an ablatable light-shielding layer having a thickness of 0.7 μm. The presensitized lithographic printing plate was imagewise exposed to laser light and then overall-exposed for 45 sec. in a similar manner to Example 1. Ater being dipped in a developer having the following composition, the surface of the plate was lightly rubbed with absorbent cotton to remove an unexposed portion.
Developer:

| | |
|---|---|
| Benzyl alcohol | 28 g |
| Triethanolamine | 13 g |
| Sodium sulfite | 2 g |
| Alkylphenylpolyethylene glycol ether | 10 g |
| Water | 955 g |

As a result thereof, it was shown that developability was excellent, without press stain and the plate life was 130,000 sheets.

Example 4

An experiments was carried out in a similar manner to Example 1, provided that the composition of the light-shielding layer was varied as shown in Table 1 (Samples Nos.4-1, 4-3, 4-5 and 4-6). Further, another experiment was carried out in a similar manner to Example 2, provided that the composition of the light-shielding layer was varied as shown in Table 1 (Samples Nos. 4-2 and 4-4).

Coating solution compositions of the light-shielding layer, 3, 4, Comp.1 to 3 are as follows.

Light-shielding layer composition 3:

| | |
|---|---|
| Water soluble polyester resin (anionic, pH, 3–5) (PES resin 200, 20% aq. solution, produced by Takamatsu Yushi) | 10 parts |
| Cadmium yellow | 1.2 parts |
| Near-infrared absorbing dye (IR-2) | 1.8 parts |
| Polyoxyethyleneoleyl phosphate | 0.1 parts |
| Water | 86.9 parts |

IR-2:

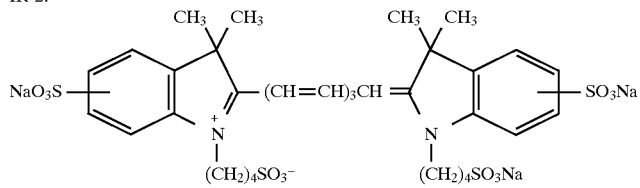

Light-shielding layer composition 4:

| | |
|---|---|
| Methylcellulose resin (SM 400 product by Shinetsu Kagaku) | 1.8 parts |
| Hanza yellow | 1.2 parts |
| Triethnolamine oleyl soap | 0.1 parts |
| Near-infrared absorbing dye (IR-3) | 2 parts |
| Water | 94.9 parts |

IR-3

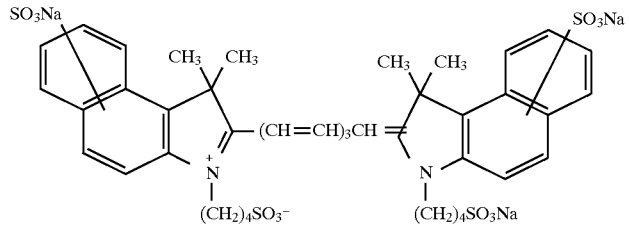

Light-shielding layer composition (Comp. 1):

| | |
|---|---|
| Carbon black | 2 parts |
| Nitrocellulose | 1.4 parts |
| Alkyd resin | 4.6 parts |
| Methyl ethyl ketone | 92 parts |

Light-shielding layer composition (Comp. 2):

| | |
|---|---|
| Nitrocellulose | 2 parts |
| Near-infrared absorbing dye (IR-4) | 1.8 parts |
| Cadmium yellow | 1.2 parts |
| Methyl cellosolve | 95 parts |

IR-4

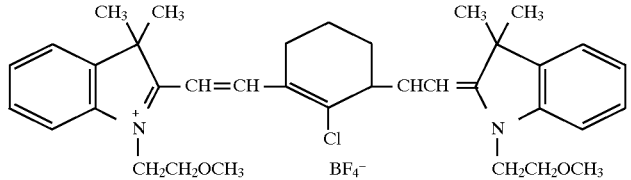

Light-shielding layer composition (Comp. 3):

| | |
|---|---|
| Gelatin | 1.5 parts |
| Carbon black aqueous dispersion (including 1.5 parts of carbon black) | 5.0 parts |

(DISPERSE BLACK SD9020: carbon black, 30% and
dispersing agent, 10%)
Water                                                                93.5 parts

TABLE 1

| Sample No. | Photosensitive layer | Light-shielding layer Composition | Light-shielding layer Thickness ($\mu$m) | developability | plate life (sheets) | Remarks |
|---|---|---|---|---|---|---|
| 4-1 | (1) | 3 | 0.7 | Good | 200,000 | Inv. |
| 4-2 | (2) | 3 | 0.7 | Good | 150,000 | Inv. |
| 4-3 | (1) | 4 | 0.7 | Good | 200,000 | Inv. |
| 4-4 | (2) | Comp. 1 | 1.0 | No good * | Not printable | Comp. |
| 4-5 | (1) | Comp. 2 | 0.5 | Stain | Not printable | Comp. |
| 4-6 | (1) | Comp. 3 | 0.6 | Stain | Not printable | Comp. |

* Line with reduction

In samples 4-4 and 4-5, the light-shielding layer peeled away from the upper-side of the photosensitive layer during development and remained in a developer, as a insoluble residue. When observing ablated portions of developed samples 4-4 to 6, it was shown that carbon black was welded with the photosensitive layer, so that the photosensitive layer was not completely removed.

Example 5

A coating solution of a light-shielding layer was prepared accoding to the formula as described below. A photosensitive layer and a light-shielding layer were each coated in this order on a grained aluminum plate in the same manner as in Example 1.

Photosensitive layer:

A solution of the photosensitive layer, which was the same as in Example 1 was coated so as to have a thickness of dried coating of 2.0 $\mu$m by means of wire-bar.

Light-shielding layer:

The following solutions A and B for the light-shielding layer were dispersed according to the procedure as described below, and the resulting dispersion was mixed with a solution C for the light-shielding layer to prepare a coating solution of the light-shielding layer. The coating solution was coated on the photosensitive layer by a wire-bar so as to have a thickness of dried coating of 0.6 $\mu$m.

| Solution A for light-shielding layer: | |
|---|---|
| Near-infrared absorbing dye (IR820B, product by Nihon kayaku) | 7 parts |
| Di-2-ethylhexylphthalate (product by Kantoh Kagaku) | 7 parts |
| Methyl ethyl ketone | 86 parts |
| Solution B for light-shielding layer: | |
| Ossein gelatin | 8 parts |
| Surfactant (Alkanol XC, product by du'Pont) | 2 parts |
| Water | 90 parts |
| Solution C for light-shielding layer: | |
| Surfactant (surf-1) | 0.1 parts |
| Gelatin | 6.1 parts |
| Colloidal silver | 3.8 parts |
| Water | 90 parts |

Surf-1:
$$NaO_3S-\underset{\underset{CH_2COOC_{10}H_{21}}{|}}{CHCOOC_5H_{11}}$$

Solutions A and B each were stirred with a stirrer (50 rpm), under tight sealing, at 50° C. over a period of 20 min.

Solution A was slowly added dropwise to Solution B in a weight ratio of Solution A to B of 2:5., while a vessel containing Solution B was maintained at 4° to 8° C. by cooling with ice water, stirred with a stirrer (30 rpm) and dispersed with a ultra-sonic homogenizer.

The resulting dispersion (a mixed solution of Solutions A and B) was mixed with Solution C in a weight ratio of 1:1 with stirring to prepare a coating solution of the light-shielding layer.

The thus-prepared presensitized lithographic printing plate was exposed to infrared laser light and UV radiation, developed and evaluated in a manner similar to Example 1. The result thereof was excellent in developability and the plate life was proved to be 200,000 sheets.

Example 6

A presensitized lithographic printing plate was prepared in the same manner as Example 5, except that a near-infrared absorbing dye, G022 (product by Nihon Kayaku) was employed in place of a dye IR820B. The thus-prepared presensitized lithographic printing plate was exposed to YAG laser (50 W) and UV radiation, developed and was evaluated with respect to the printing test in a similar manner to Example 1. The result thereof was excellent in developability and the plate life was proved to be 200,000 sheets.

Example 7

A presensitized lithographic printing plate which was prepared in Example 1 was exposed to laser light according to the following exposure condition, and compared with each other with respect to ablatability. Results thereof are shown in Table 2.

TABLE 2

| Laser output power (mW) | Spot diameter ($\mu$m) | Optical efficiency (%) | Power density (W/cm$^2$) | Exposure speed (m/sec.) | Ablated hole diameter ($\mu$m) | Developability |
|---|---|---|---|---|---|---|
| 500 | 10 | 50 | 318000 | 2 | 11 | Good |
| 500 | 25 | 50 | 50000 | 0.3 | 0 | No good |

As can be seen from Table 2, in the case where the power density at the exposed surface was low, ablation was insufficient even when the exposure speed was made lowered so that am image was not formed.

Example 8

A photosensitive layer was coated on a grained aluminum plate in a similar manner to Example 1.
(Coating of interlayer)

A coating solution for an interlayer having the following composition was coated on the photosensitive layer with a wire-bar and dried to provide an interlayer having a dry thickness of 2 mm.

Interlayer coating solution 1

| | |
|---|---|
| Novolak resin-1 | 20 parts |
| Methyl ethyl ketone | 80 parts |

(Coating of ablatable light-shielding layer)

Next, a coating solution for an ablatable light-shieling layer having the folowing composition was coated on the interlayer with a wire-bar and dried to form an ablatable light-shielding layer having a thickness of 0.8 mm and obtain a presensitized lithographic printing plate sample 1.

Light-shielding layer coating solution 1

| | |
|---|---|
| Gelatin | 2.3 parts |
| Near-infrared absorbing dye (IR-1) | 1.4 parts |
| Colloidal silver | 0.8 parts |
| Water | 95.5 parts |

IR-1

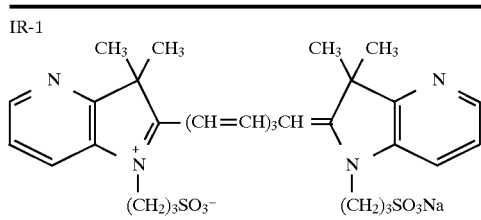

(Image formation)

Ablation of light-shielding layer:

The thus-prepared presensitized lithographic printing plate was exposed to laser from semiconductor laser LT090MD (product by Sharp, wavelength of 830 nm, maximum light output of 100 mW. The light-shielding layer was ablated by scanning with a condensed spot having a diameter of 6 $\mu$m at a scanning speed of 1.3 m/sec. (Optical efficiency was 60%.) Ablated portions which were each in a dot form had a dot size of 6.5 $\mu$m in diameter. Further, the laser was modulated through RIP and a pattern exposure was made through a 175-lines screen by changing a dot percentage at intervals of 10% in a range of from 0 to 100%.

Exposure of photosensitive layer:

The thus-ablated plate was overall exposed for 70 sec. at 90 cm far apart from a light source of 2 kW metal halide lamp (product Iwasakielectric Co., Idlufin 200).

Development:

Next, the exposed sample was developed at 25° C. for 30 sec. with a developer which was prepared by diluting a developer SDP-1 (product by Konica) by 7 to 9 timed. Resultingly, development was proved to be good.

Printing:

The printing was conducted using a sheet-fed press, so that the plate life was shown to be 150,000 sheets.

Example 9

A photosensitive layer was coated on a grained aluminum plate in a similar manner to Example 1.

Coating of light-heat converting layer:

Next, a coating solution for a light-heat converting layer having the following composition was coated on the photosensitive layer with a wire-bar and dried to form a light-heat converting layer with a thickness of 0.3 $\mu$m Light-heat converting layer coating solution

| | |
|---|---|
| Gelatin | 2.4 parts |
| Near-infrared absorbing dye (IR-1) | 1.6 parts |
| Water | 96.0 parts |

IR-1

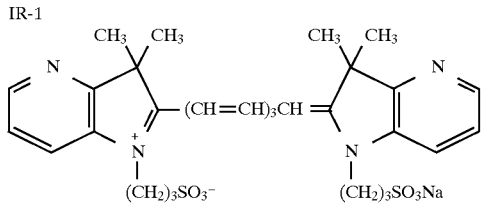

In the case when the coating solution for the light-converting layer on a transparent PET (polyethylene terephthalate) base in a similar manner to the above, an absorbance thereof was 88% and 7% at 830 nm and 400 nm, respectively.

Coating of light-shielding layer:

The following light-shielding layer was coated on the light-heat onverting layer above-described wit a wire-bar and dried to form a light-shieling layer with a thickness of 0.6 $\mu$m. Thus, a positive-working presensitized lithographic printing plate was pepared.

Light-shielding layer coating solution:

| | |
|---|---|
| Novolak resin-1 | 0.8 parts |
| Red iron oxide TF 100 (product by Toda Kogyo) | 4.1 parts |
| CAFACRE-610 (product by Toho Kagaku) | 0.1 parts |
| Methyl ethyl ketone | 95.0 parts |

In the case when this coating solution for the light-shielding layer was coated on a transparent PET base in a similar manner to the above, an absorbance thereof was shown to be 19% and 99.1% at 830 nm and 400 nm, respectively.

Laser exposure:

The thus-prepared presensitized lithographic printing plate was exposed to laser light from semiconductor laser LT090MD (product by Sharp, wavelength of 830 nm, maximum light output of 100 mW. The light-shielding layer was ablated by scanning with a condensed spot having a diameter of 6 $\mu$m at a scanning speed of 1.3 m/sec. (Optical efficiency was 60%.) Ablated portions which were in a dot form had adot size of 6.5 $\mu$m in diameter. Further, the laser was modulated through RIP and a pattern exposure was made through a 175-line screen by changing a dot percentage at intervals of 10% in a range of from 0 to 100%.

Exposure of photosensitive layer:

The thus-ablated plate was overall exposed for 70 sec. at a position of 90 cm far from a light source of 2 kW metal halide lamp (product Iwasakielectric Co., Idlufin 200).

Development:

Next, the exposed sample was developed at 25° C. for 30 sec. with a developer which was prepared by diluting a developer SDP-1 (product by Konica) by 7 to 9 timed. Resultingly, development was proved to be good.

Printing:

The printing was conducted using a sheet-fed press, so that the plate life was shown to be 150,000 sheets.

According to the present invention, it is possible to prepare a lithographic printing plate directly from digital imge signals without the use of a film which is employed as an intermediate in the plate-making process; a method for preparing a lithographic printing plate directly from digital image signals is provided, wherein a ablatable light-shielding layer, which can be industrially prepared readily and at a moderate price, can be removed sufficiently during a process of development without the need of removing a masking layer at an unexposed portion and adverse effect on a photosensitive layer.

What is claimed is:

1. A method for preparing a lithographic printing plate by a process comprising the steps of imagewise exposing a presensitized lithographic printing plate, comprising a support having thereon a photosensitive layer and an ablatable and water-soluble or aqueous alkali-soluble light-shielding layer containing a water-soluble or aqueous alkali-soluble resin, to a first light having a first wavelength, to remove the imagewise exposed portion of the light-shielding layer by ablation, overall exposing the presensitized plate to a second light having a second wavelength to expose the photosensitive layer at portions in which the light-shielding layer has been removed and developing the overall exposed plate with a developer to remove the unremoved water soluble or aqueous alkali-soluble light-shielding layer and a non-imaging portion of the photosensitive layer to obtain the lithographic printing plate, wherein said light-shielding layer substantially cuts off the second light having the second wavelength to prevent a photochemical reaction from occurring in said photosensitive layer, said photosensitive layer photochemically reacting in response to the second light and containing an o-quinonediazide compound or a diazo compound.

2. The method for preparing a lithographic printing plate of claim 1, wherein said light-shielding layer contains a light-heat converting substance capable of causing conversion of light into heat upon absorption of the first light and a substance capable of absorbing the second light.

3. The method for preparing a lithographic printing plate of claim 1, wherein said light-shielding layer comprises a light-heat converting layer capable of converting light to heat upon absorption of the first light and a shielding layer capable of shielding said photosensitive layer from the second light.

4. The method for preparing a lithographic printing plate of claim 1, wherein said presensitized plate has an interlayer provided between said photosensitive layer and light-shielding layer.

5. The method for preparing a lithographic printing plate of claim 1, wherein said first light is a laser light having a power density of 100000 W/cm$^2$ or more, being exposed at an exposing speeed of 0.4 m/sec. or more.

6. The method for preparing a lithographic printing plate of claim 1, said second light is a ultraviolet radiation.

7. The method for preparing a lithographic printing plate of claim 1, wherein said first wavelength is not less than 500 nm and said second wavelength is less than 500 nm.

8. The method for preparing a lithographic printing plate of claim 1, wherein said light-shielding layer absorbs 80% or more of the first light.

9. The method for preparing a lithographic printing plate of claim 1, wherein said light-shielding layer absorbs 97% or more of the second light.

10. A presensitized lithographic printing plate comprising a support having thereon a photosensitive layer and an ablatable light-shielding layer capable of absorbing a laser light and a light to which said photosensitive layer is sensitive, said light-shielding layer being water-soluble or aqueous alkali-soluble and comprising a substance capable of absorbing a laser light, a substance capable of absorbing a light to which said photosensitive layer is sensitive and a water-soluble or aqueous alkali-soluble resin; said photosensitive layer containing an o-quinonediazide compound or a diazo compound.

11. The presensitized lithographic printing plate of claim 10, wherein said light-shielding layer contains a near infrared absorbing dye as the substance capable of absorbing a laser light and a water-soluble resin.

12. The presensitized lithographic printing plate of claim 10, wherein said photosensitive layer contains said o-quinonediazide compound.

13. The presensitized lithographic printing plate of claim 10, wherein said photosensitive layer contains said diazo compound.

14. The presensitized lithographic printing plate of claim 12, wherein said near infrared absorbing dye is water-soluble.

15. The presensitized lithographic printing plate of claim 11, wherein said photosensitive layer contains a o-quinonediazide compound.

16. The presensitized lithographic printing plate of claim 12, wherein said photosensitive layer contains a diazo compound.

* * * * *